US012002668B2

United States Patent
Yedla et al.

(10) Patent No.: US 12,002,668 B2
(45) Date of Patent: Jun. 4, 2024

(54) THERMAL MANAGEMENT HARDWARE FOR UNIFORM TEMPERATURE CONTROL FOR ENHANCED BAKE-OUT FOR CLUSTER TOOL

(71) Applicant: Applied Materials, Inc., Santa Clara, CA (US)

(72) Inventors: Srinivasa Rao Yedla, Bangalore (IN); Kirankumar Neelasandra Savandaiah, Bangalore (IN); Thomas Brezoczky, Los Gatos, CA (US); Hari Prasath Rajendran, Coimbatore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 11 days.

(21) Appl. No.: 17/359,348

(22) Filed: Jun. 25, 2021

(65) Prior Publication Data
US 2022/0415635 A1    Dec. 29, 2022

(51) Int. Cl.
*H01J 37/34* (2006.01)
*C23C 14/35* (2006.01)
*C23C 14/54* (2006.01)

(52) U.S. Cl.
CPC .......... *H01J 37/3488* (2013.01); *C23C 14/35* (2013.01); *C23C 14/54* (2013.01); *H01J 2237/2001* (2013.01); *H01J 2237/332* (2013.01)

(58) Field of Classification Search
CPC .......... H01J 37/3488; H01J 2237/2001; H01J 2237/332; H01J 37/32522; C23C 14/35; C23C 14/54; C23C 14/541; H01L 21/67167; H01L 21/6719; H01L 21/67207; H01L 21/68707; H01L 21/68764; H01L 21/67196; H01L 21/67201;
(Continued)

(56) References Cited

U.S. PATENT DOCUMENTS

| 5,019,233 A | * | 5/1991 | Blake ................. H01L 21/67201 |
| | | | 414/217 |
| 5,863,170 A | | 1/1999 | Boitnott et al. |
| 5,879,459 A | | 3/1999 | Gadgil et al. |

(Continued)

FOREIGN PATENT DOCUMENTS

| CN | 100411095 C | 8/2008 |
| CN | 102965643 B | 2/2016 |

(Continued)

OTHER PUBLICATIONS

International Search Report and Written Opinion dated Sep. 4, 2020 for Application No. PCT/US2020/033456.
U.S. Appl. No. 17/165,427, filed Feb. 2, 2021.

*Primary Examiner* — Nicholas A Smith
*Assistant Examiner* — Patrick S Ott
(74) *Attorney, Agent, or Firm* — Patterson & Sheridan LLP

(57) ABSTRACT

Aspects of the disclosure provided herein generally provide a substrate processing system that includes: a processing chamber including: a top plate having an array of process station openings disposed therethrough surrounding a central axis, a bottom plate having a first central opening, and a plurality of side walls between the top plate and the bottom plate; a plurality of heaters disposed in the top plate and the bottom plate and configured in a plurality of regions; and a system controller configured to independently control the plurality of heaters in each region.

12 Claims, 10 Drawing Sheets

(58) Field of Classification Search
CPC ......... H01L 21/67161; H01L 21/67742; H01L 21/67748; B65G 29/00
USPC .................................... 118/724; 204/298.09
See application file for complete search history.

(56) References Cited

U.S. PATENT DOCUMENTS

| | | | |
|---|---|---|---|
| 6,162,299 A | 12/2000 | Raaijmakers | |
| 6,222,990 B1* | 4/2001 | Guardado | C30B 25/10 |
| | | | 219/390 |
| 6,233,948 B1* | 5/2001 | Morishita | F04B 37/08 |
| | | | 62/55.5 |
| 6,440,261 B1 | 8/2002 | Tepman et al. | |
| 6,447,607 B2 | 9/2002 | Soininen et al. | |
| 6,576,062 B2 | 6/2003 | Matsuse | |
| 6,604,853 B2 | 8/2003 | Chao et al. | |
| 6,635,115 B1 | 10/2003 | Fairbairn et al. | |
| 6,852,194 B2 | 2/2005 | Matsushita et al. | |
| 6,962,471 B2 | 11/2005 | Birkner et al. | |
| 7,066,703 B2 | 6/2006 | Johnson | |
| 7,090,741 B2 | 8/2006 | Narushima et al. | |
| D527,751 S | 9/2006 | Kondoh et al. | |
| 7,138,336 B2 | 11/2006 | Lee et al. | |
| 7,169,234 B2 | 1/2007 | Weeks et al. | |
| 7,189,432 B2 | 3/2007 | Chiang et al. | |
| 7,258,768 B2 | 8/2007 | Yamazaki | |
| 7,318,869 B2 | 1/2008 | Chiang et al. | |
| 7,422,406 B2 | 9/2008 | van der Meulen | |
| 7,458,763 B2 | 12/2008 | van der Meulen | |
| 7,537,662 B2 | 5/2009 | Soininen et al. | |
| 7,784,164 B2 | 8/2010 | White et al. | |
| 7,799,179 B2 | 9/2010 | Maass et al. | |
| 7,806,983 B2 | 10/2010 | Chiang et al. | |
| 7,833,352 B2 | 11/2010 | Bondestam et al. | |
| 7,905,991 B2 | 3/2011 | Esselbach et al. | |
| 7,959,403 B2 | 6/2011 | van der Meulen | |
| 7,988,399 B2 | 8/2011 | van der Meulen | |
| 8,029,226 B2 | 10/2011 | van der Meulen | |
| 8,033,772 B2 | 10/2011 | Kurita et al. | |
| 8,088,678 B2 | 1/2012 | Kitano et al. | |
| 8,197,177 B2 | 6/2012 | van der Meulen et al. | |
| 8,216,380 B2 | 7/2012 | White et al. | |
| 8,267,632 B2 | 9/2012 | van der Meulen et al. | |
| 8,292,563 B2 | 10/2012 | Haris | |
| 8,313,277 B2 | 11/2012 | van der Meulen et al. | |
| 8,354,656 B2 | 1/2013 | Beloussov et al. | |
| 8,403,613 B2 | 3/2013 | van der Meulen | |
| 8,434,989 B2 | 5/2013 | van der Meulen | |
| 8,439,623 B2 | 5/2013 | van der Meulen | |
| 8,500,388 B2 | 8/2013 | van der Meulen et al. | |
| 8,523,507 B2 | 9/2013 | van der Meulen | |
| 8,558,299 B2 | 10/2013 | Cao et al. | |
| 8,574,409 B2 | 11/2013 | Kadlec et al. | |
| 8,602,716 B2 | 12/2013 | van der Meulen et al. | |
| 8,672,605 B2 | 3/2014 | van der Meulen et al. | |
| 8,696,298 B2 | 4/2014 | van der Meulen et al. | |
| 8,728,239 B2 | 5/2014 | Bauer et al. | |
| 8,807,905 B2 | 8/2014 | Meulen | |
| 8,812,150 B2 | 8/2014 | van der Meulen et al. | |
| 8,870,513 B2 | 10/2014 | Voser et al. | |
| 8,870,514 B2 | 10/2014 | van der Meulen et al. | |
| 8,895,450 B2 | 11/2014 | Cao et al. | |
| 8,944,738 B2 | 2/2015 | van der Meulen | |
| 8,945,308 B2 | 2/2015 | Schaller | |
| 9,005,539 B2 | 4/2015 | Halpin et al. | |
| 9,085,825 B2 | 7/2015 | Kim | |
| 9,103,030 B2 | 8/2015 | Kato et al. | |
| 9,214,589 B2 | 12/2015 | Voser et al. | |
| 9,252,037 B2 | 2/2016 | Scholte Von Mast et al. | |
| 9,281,222 B2 | 3/2016 | Weaver et al. | |
| 9,336,997 B2 | 5/2016 | Bera | |
| 9,340,874 B2 | 5/2016 | Halpin et al. | |
| 9,347,131 B2 | 5/2016 | Maass et al. | |
| 9,355,824 B2 | 5/2016 | Kadlec et al. | |
| 9,378,994 B2 | 6/2016 | Weaver et al. | |
| 9,396,981 B2 | 7/2016 | Scholte Von Mast et al. | |
| 9,443,749 B2 | 9/2016 | Wakabayashi et al. | |
| 9,478,420 B2 | 10/2016 | Castaldi et al. | |
| 9,490,149 B2 | 11/2016 | Chandrasekharan et al. | |
| 9,551,068 B2 | 1/2017 | Kumagai et al. | |
| 9,583,349 B2 | 2/2017 | Gandikota et al. | |
| 9,587,306 B2 | 3/2017 | Rohrmann et al. | |
| 9,644,261 B2 | 5/2017 | Weichart et al. | |
| 9,698,009 B2 | 7/2017 | Sato et al. | |
| 9,831,094 B2 | 11/2017 | Rahtu et al. | |
| 9,842,755 B2 | 12/2017 | Ocker et al. | |
| 9,884,726 B2 | 2/2018 | van der Meulen et al. | |
| 9,890,473 B2 | 2/2018 | Newman | |
| 9,929,008 B2 | 3/2018 | Wamura et al. | |
| 9,932,674 B2 | 4/2018 | Kato et al. | |
| 9,953,843 B2 | 4/2018 | Shen et al. | |
| 9,960,072 B2 | 5/2018 | Coomer | |
| 10,043,693 B1 | 8/2018 | Kim et al. | |
| 10,086,511 B2 | 10/2018 | van der Meulen | |
| 10,138,553 B2 | 11/2018 | Scholte Von Mast et al. | |
| 10,145,014 B2 | 12/2018 | Nozawa et al. | |
| 10,202,682 B2 | 2/2019 | Rieschl et al. | |
| 10,202,687 B2 | 2/2019 | Miura et al. | |
| 10,221,480 B2 | 3/2019 | Kato et al. | |
| 10,256,125 B2 | 4/2019 | Weaver et al. | |
| 10,262,888 B2 | 4/2019 | Gangakhedkar et al. | |
| 10,347,470 B2 | 7/2019 | Lv et al. | |
| 10,347,515 B2 | 7/2019 | Heinz | |
| 10,388,559 B2 | 8/2019 | Rieschl et al. | |
| 10,427,303 B2 | 10/2019 | Weaver et al. | |
| 10,586,720 B2 | 3/2020 | Weaver et al. | |
| 2001/0002278 A1* | 5/2001 | Vu | C23C 16/46 |
| | | | 204/192.12 |
| 2002/0051698 A1 | 5/2002 | Birkner et al. | |
| 2002/0170671 A1 | 11/2002 | Matsushita et al. | |
| 2003/0101938 A1* | 6/2003 | Ronsse | C23C 16/4401 |
| | | | 118/712 |
| 2003/0109094 A1 | 6/2003 | Seidel et al. | |
| 2004/0159553 A1 | 8/2004 | Nogami et al. | |
| 2004/0261710 A1 | 12/2004 | Matsushita et al. | |
| 2005/0005850 A1 | 1/2005 | Yamazaki | |
| 2005/0006230 A1 | 1/2005 | Narushima et al. | |
| 2005/0111936 A1 | 5/2005 | Kim et al. | |
| 2005/0115822 A1 | 6/2005 | Maass et al. | |
| 2005/0118009 A1 | 6/2005 | van der Meulen | |
| 2005/0173404 A1* | 8/2005 | Benjamin | H01L 21/67248 |
| | | | 219/444.1 |
| 2006/0051507 A1 | 3/2006 | Kurita et al. | |
| 2006/0056952 A1 | 3/2006 | Haris | |
| 2006/0101728 A1 | 5/2006 | White et al. | |
| 2006/0137608 A1 | 6/2006 | Choi et al. | |
| 2006/0137609 A1 | 6/2006 | Puchacz et al. | |
| 2006/0157340 A1 | 7/2006 | Kurita et al. | |
| 2006/0201074 A1 | 9/2006 | Kurita et al. | |
| 2006/0263177 A1 | 11/2006 | Meulen | |
| 2007/0020890 A1 | 1/2007 | Thakur et al. | |
| 2007/0215036 A1 | 9/2007 | Park et al. | |
| 2007/0281090 A1 | 12/2007 | Kurita et al. | |
| 2008/0014055 A1 | 1/2008 | van der Meulen | |
| 2008/0072821 A1 | 3/2008 | Dalton et al. | |
| 2008/0124194 A1 | 5/2008 | van der Meulen et al. | |
| 2008/0124197 A1 | 5/2008 | van der Meulen et al. | |
| 2008/0138176 A1 | 6/2008 | Kim et al. | |
| 2008/0187417 A1 | 8/2008 | van der Meulen et al. | |
| 2008/0219808 A1 | 9/2008 | van der Meulen et al. | |
| 2008/0219812 A1 | 9/2008 | van der Meulen et al. | |
| 2008/0226429 A1 | 9/2008 | van der Meulen | |
| 2008/0232947 A1 | 9/2008 | van der Meulen et al. | |
| 2009/0087286 A1 | 4/2009 | Meulen | |
| 2009/0173622 A1 | 7/2009 | Weichart et al. | |
| 2009/0180847 A1 | 7/2009 | Guo et al. | |
| 2010/0012036 A1 | 1/2010 | Silva et al. | |
| 2010/0075453 A1 | 3/2010 | Kurita et al. | |
| 2010/0120238 A1 | 5/2010 | Kitano et al. | |
| 2010/0212592 A1* | 8/2010 | Li | C23C 16/4409 |
| | | | 118/723 R |
| 2010/0281683 A1 | 11/2010 | White et al. | |
| 2010/0304027 A1 | 12/2010 | Lee et al. | |
| 2010/0327187 A1 | 12/2010 | Beloussov et al. | |

(56) References Cited

U.S. PATENT DOCUMENTS

| | | |
|---|---|---|
| 2012/0027542 A1 | 2/2012 | Isomura et al. |
| 2012/0031749 A1 | 2/2012 | Dubs et al. |
| 2012/0079982 A1* | 4/2012 | Lubomirsky ..... H01L 21/67196 34/209 |
| 2012/0161405 A1* | 6/2012 | Mohn ................ C23C 16/463 279/142 |
| 2012/0251721 A1* | 10/2012 | Matsumoto ....... H01L 21/68742 427/248.1 |
| 2012/0328797 A1 | 12/2012 | Maass et al. |
| 2013/0302115 A1 | 11/2013 | Wakabayashi et al. |
| 2014/0186999 A1* | 7/2014 | Schweikert ......... H01L 21/6719 438/106 |
| 2014/0262035 A1 | 9/2014 | Merry et al. |
| 2014/0349011 A1 | 11/2014 | Weichart |
| 2015/0024360 A1 | 1/2015 | Mantynen |
| 2015/0063957 A1 | 3/2015 | Olgado |
| 2015/0240360 A1* | 8/2015 | Leeser ............... H01L 21/67196 118/723 R |
| 2016/0108515 A1 | 4/2016 | Elghazzali et al. |
| 2016/0138159 A1 | 5/2016 | Kato et al. |
| 2017/0175247 A1 | 6/2017 | Weichart |
| 2017/0218514 A1 | 8/2017 | Kato et al. |
| 2018/0142350 A1 | 5/2018 | Fukiage et al. |
| 2018/0195173 A1 | 7/2018 | Kato et al. |
| 2018/0245212 A1 | 8/2018 | Schwyn-Thony et al. |
| 2018/0245218 A1 | 8/2018 | Kato |
| 2018/0261473 A1 | 9/2018 | Weichart et al. |
| 2018/0334745 A1 | 11/2018 | Kato |
| 2019/0013225 A1 | 1/2019 | Taguchi et al. |
| 2019/0096715 A1 | 3/2019 | Lodder et al. |
| 2019/0148186 A1* | 5/2019 | Schaller ............ H01L 21/67126 432/47 |
| 2019/0181028 A1* | 6/2019 | Patel ................... C23C 16/4586 |
| 2019/0252160 A1 | 8/2019 | Balon et al. |
| 2019/0252166 A1 | 8/2019 | Felzer et al. |
| 2020/0381276 A1 | 12/2020 | Yedla et al. |

FOREIGN PATENT DOCUMENTS

| | | |
|---|---|---|
| CN | 105734520 B | 8/2018 |
| CN | 105355581 B | 9/2018 |
| CN | 105200393 B | 10/2018 |
| CN | 111696882 A | 9/2020 |
| DE | 10350517 A1 | 6/2005 |
| DE | 102012103295 A1 | 7/2013 |
| DE | 102013111790 A1 | 4/2015 |
| DE | 102013113052 A1 | 5/2015 |
| EP | 2102889 A2 | 9/2009 |
| JP | 5088284 B2 | 12/2012 |
| JP | 5315898 B2 | 10/2013 |
| JP | 5544697 B2 | 7/2014 |
| JP | 5870568 B2 | 3/2016 |
| JP | 6330623 B2 | 5/2018 |
| JP | 6464765 B2 | 2/2019 |
| JP | 6478847 B2 | 3/2019 |
| JP | 2019036630 A | 3/2019 |
| KR | 101887072 B1 | 8/2018 |
| WO | 0137317 A1 | 5/2001 |
| WO | 2017212077 A2 | 12/2017 |
| WO | 2018197305 A2 | 11/2018 |
| WO | 2019020391 A1 | 1/2019 |
| WO | 2019020393 A1 | 1/2019 |
| WO | 2019096515 A1 | 5/2019 |
| WO | 2019096564 A1 | 5/2019 |
| WO | 2019105671 A1 | 6/2019 |

* cited by examiner

THERMAL MANAGEMENT HARDWARE FOR UNIFORM TEMPERATURE CONTROL FOR ENHANCED BAKE-OUT FOR CLUSTER TOOL

FIELD

The present disclosure relates to an apparatus and method of processing substrates in a sub-atmospheric pressure environment. More particularly, the present disclosure relates to cleaning an interior of a processing chamber by heating the chamber's interior surfaces to an elevated temperature.

BACKGROUND

Deposition and dry etch processes are used to form layers on, and remove all or a portion of one or more layers from, a substrate. For example, it is known to deposit thin metal and dielectric films on substrates, such as directly on a semiconductor substrate or on film layers already formed thereon, using a sputtering process, also known as physical vapor deposition or "PVD". In PVD, a vacuum chamber holds a target and a substrate support having a substrate thereon, and the target, composed of a metal or a dielectric, is negatively charged and exposed to an inert gas plasma to cause plasma formed gas ions to bombard the target and sputter material therefrom such that at least a portion of that material is deposited on the substrate.

Another method of forming a thin film on a substrate is commonly referred to as chemical vapor deposition, or "CVD". In a CVD process, a substrate is loaded into a vacuum chamber, and one or more chemical precursors having the components of a thin film to be formed on the substrate are introduced into the vacuum chamber. Deposition of the thin film on the substrate, or on a layer thereon, occurs by one or more of a thermal reaction where the temperature of the substrate is sufficient to cause the precursor to decompose and leave behind one or more atoms of the thin film material to be deposited, by reaction of the chemical precursors with each other, at the substrate surface, over the substrate surface, or both, to form and leave on the substrate surface an atom or molecule of the thin film material to be deposited as a result of the reaction.

Dry etching, commonly used in semiconductor processing to form features in a substrate, or in one or more thin films on the substrate is typically a reactive ion etch process. Here, a plasma composed of an inert gas and one or more etching gases is formed in a vacuum chamber, and the material underlying a patterned mask layer is exposed to etching reactants in the plasma, while the substrate or substrate support is negatively biased to also cause ions in the plasma to physically remove material of the underlying layer exposed through the openings in the mask layer. Etching radicals are simultaneously created from the etching gas in the plasma to chemically interact with and chemically etch the material of the underlying layer exposed through the openings in the mask layer.

Many thin film deposition and etch processes used in semiconductor and flat panel display production employ substrate processing chambers that are attached to a mainframe of a cluster tool, referred to as a substrate processing system, wherein one or more substrates are loaded into a dedicated processing chamber (e.g., a vacuum chamber) having dedicated hardware therein to support the substrate during a process performed thereon. Contaminants, such as moisture or gaseous elements, may enter the processing chamber through a faulty seal or connection or when the inside of the processing chamber is exposed to the atmosphere, such as when maintenance is performed on the substrate processing system. Such contaminants may affect the quality and properties of the film deposition or etch process. If one chamber is contaminated, then the entire processing chamber may be considered inoperable until cleaned.

Contaminants are removed by sealing the chamber, maintaining a vacuum inside the chamber, and heating the chamber's interior surfaces to an elevated temperature for a period of time to vaporize the contaminants. A pump, such as a vacuum pump, removes the vaporized contaminants. This process is hereinafter referred to as a bake-out. After the bake-out process is complete, the vacuum is maintained and the chamber is cooled to a threshold temperature for operating. The time required to bake-out and cool the chamber adds overhead time to the total time required to process substrates over time in a cluster tool (referred to as a substrate processing system), decreases throughput, and increases cost of ownership (CoO).

Heating the chamber's interior surfaces is challenging because the processing chamber varies in thickness. Additionally, various structures can attach to the processing chamber and may draw heat away from the processing chamber. While the conventional cluster tool designs are suitable for heating the processing chamber and removing contaminants from inside the processing chamber, such cluster tools can result in chamber matching issues with a large number of hot and cold spots in the processing chamber, result in a non-uniform temperature of the different processing chamber surfaces during bake-out and cooling, require use of specialty high-temperature O-rings in the processing chamber, cause issues such as arcing which leads to increased preventative maintenance, or require a longer cooling time before returning to operation. These result in lower availability of the processing chamber and lower throughput of substrates because of increased maintenance time and have a high CoO.

Therefore, there is a need for a system and a method of heating the interior surfaces of a chamber that solves the problems described above.

SUMMARY

Embodiments of the present disclosure generally relate to substrate processing systems. In particular, embodiments herein provide systems and methods for heating interior surfaces of a processing chamber of the substrate processing system.

In one embodiment, a substrate processing system is provided. The substrate processing system includes a processing chamber. The processing chamber includes a top plate having an array of process station openings disposed therethrough surrounding a central axis, a bottom plate having a first central opening, and a plurality of side walls between the top plate and the bottom plate. The substrate processing chamber further includes a plurality of heaters disposed in the top plate and the bottom plate of the processing chamber and configured in a plurality of regions and a system controller configured to independently control the plurality of heaters in each region.

In another embodiment, a substrate processing system is provided. The substrate processing system includes a processing chamber. The processing chamber includes a top plate having an array of process station openings that surround a central axis, a bottom plate having a central opening, and a plurality of side walls connecting the top and bottom plates. A chamber volume is defined by the top plate, the bottom plate, and the plurality of side walls. The substrate processing system further includes a first plurality of heater assemblies disposed in the top plate and the bottom plate. Each heater assembly of the first plurality of heater assemblies comprises a plurality of upper heaters and a plurality of lower heaters, and each upper heater and each lower heater of the first plurality of heater assemblies is positioned between the array of process station openings and extends inward towards the central opening.

In another embodiment, a substrate processing system is provided. The substrate processing system includes a processing chamber. The processing chamber includes a top plate having an array of process station openings disposed therethrough surrounding a central axis, a bottom plate having a central opening, a plurality of side walls between the top plate and the bottom plate, and a plurality of corners formed by the top plate, the bottom plate, and the plurality of side walls. The substrate processing system further includes a plurality of heaters disposed in the top plate, the bottom plate, and the side walls configured in a plurality of regions. A first portion of the plurality of heaters are disposed in the top plate, a second portion of the plurality of heaters are disposed in the bottom plate, and a third portion of the plurality of heaters are disposed in the plurality of corners. The substrate processing system further includes a system controller configured to independently control the plurality of heaters in each region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In view of the above, both a challenge and opportunity exists to improve the bake-out process of the processing chamber by using a plurality of heaters arranged throughout the processing chamber that are controlled through different regions or zones. Accordingly, a processing chamber is provided with independently controlled heaters for an improved bake-out process and substrate processing performance over time.

As used herein, the term "about" may refer to a +/−10% variation from the nominal value. It is to be understood that such a variation can be included in any value provided herein.

Aspects of the disclosure provided herein generally provide a substrate processing system that includes at least one processing chamber (e.g., a vacuum chamber) and a pump (e.g., a vacuum pump) connected to the inside of the processing chamber. A vacuum state or condition may be maintained inside the processing chamber by the pump during operation and cleaning. The processing chamber includes a plurality of sealing elements, such as O-rings, disposed throughout. The sealing elements seal the inside of the processing chamber from an outside environment and prevent contaminants from entering the processing chamber. However, contaminants may enter or form inside the processing chamber and require removal.

The methods and apparatuses disclosed herein are useful for removing contaminants from inside the processing chamber through a bake-out process. A plurality of heaters are disposed in the processing chamber to heat the inside and inner surfaces of the processing chamber. The plurality of heaters are arranged by regions or zones that are independently controlled. Thus, power to the heaters of each region can be adjusted or turned on and off independently of the other regions. This beneficially allows control of the temperature for regions of the processing chamber corresponding to each region. Additionally, a cooling system may be used to cool the processing chamber after the bake-out process, beneficially reducing the time required to resume operation of the substrate processing system.

Processing System Configuration Examples

Figure 1:
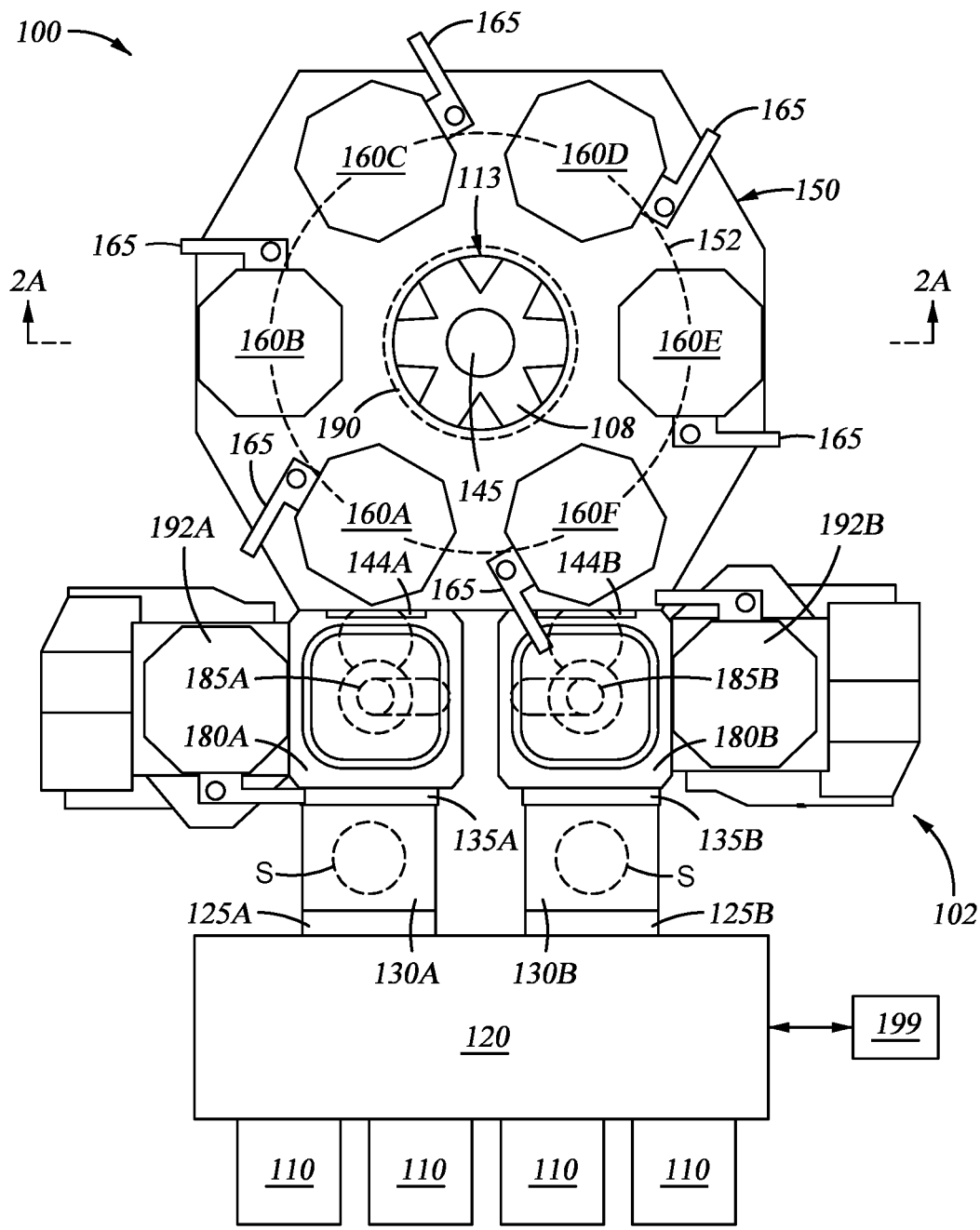
FIG. 1 is a plan view of a processing system that includes a processing chamber that includes process stations therein for processing substrates, according to one or more embodiments.

Referring to FIG. 1, an embodiment of a substrate processing system 100 is shown. The substrate processing system 100 is used to form one or more thin films on the surface of a substrate S and/or, on a layer previously formed or processed on the substrate S. In one aspect of the disclosure provided herein, a substrate processing system as shown in FIG. 1 includes an atmospheric or ambient pressure substrate input and output handling station also known as a front end 120, a substrate processing chamber 150 having multiple process stations 160 positioned thereon, and at least one intermediary section 102. A substrate is transferred into the intermediary section 102 from the front end 120 or from the processing chamber 150, or transferred from the intermediary section 102 to the front end 120 or to the processing chamber 150. While the disclosure provided herein generally illustrates a processing chamber 150 that include six process stations this configuration is not intended to be limiting as to the scope of the invention provided herein, since a processing chamber 150 might alternatively include two or more process stations 160, such as four or more process stations 160, eight or more process stations 160, ten or more process stations 160, or even 12 or more process stations 160.

The substrate processing system 100 is used to form one or more thin films on the surface of a substrate S and/or, on a layer previously formed or processed on the substrate S. The substrate may be sequentially moved along the circumference of an imaginary circle 152 which intersects a central location of each of the process stations 160, such that a plurality of a first film type layer and a plurality of a second film type layer can be sequentially deposited thereon. Each process station 160A-160F can be independently or similarly configured to enable a deposition process, for example a PVD, CVD, ALD (atomic layer deposition) or other type of deposition process, or an etching process. For example, metal layers may be deposited on a substrate and be composed of a metal, and reactive metal layers may be deposited on a substrate and be composed of a reactive metal (e.g., metal nitride). Each process station 160A-160F includes a vacuum pump 165 configured to evacuate a processing region (not shown) during the deposition processes. The process stations 160A-160F may connect to the vacuum pump 165 through a line that is configured to connect to the vacuum pump 165. By sequentially moving and sequentially processing the substrate in all of process stations 160A-160F, a pure metal/reactive metal/pure metal/reactive metal/pure metal/reactive metal multi-layer film stack can be formed.

A substrate loaded into the processing chamber 150 need not be processed at each process station 160A-160F. For example, each of the process stations 160A-160F can employ the same sputter target material, a number of substrates equal to the number of process stations 160 are loaded into the processing chamber 150, and each substrate is processed in a different one of the process stations 160 for deposition of a same material film layer thereon. Thereafter all of these substrates are removed from the processing chamber 150, and an equal number of substrates are loaded again into the processing chamber 150, and the processing of each of these substrates by a different single one of the process stations is performed. Alternatively, different processes are performed in each adjacent process station arrayed along the circumference of the imaginary circle 152. For example, a first deposition process to deposit a first type of film layer is performed in process stations 160A, 160C and 160E, and a second deposition process to deposit a second type of film layer is performed in process stations 160B, 160D and 160F. However, in this case, an individual substrate is exposed to only two process stations 160, for example a first substrate is exposed to only process stations 160A and 160B, a second substrate is exposed to only process stations 160C and 160D, and a third substrate is exposed to only process stations 160E and 160F. Then the substrates are removed. Likewise, each substrate process in the system can be processed in up to all process stations 160, and the process performed at each process station 160 can be the same or different from one or all of the remaining process stations 160.

The substrate processing system 100 generally includes the processing chamber 150, the intermediary section 102, which is coupled between the processing chamber 150 and the front end 120, and a system controller 199. As shown in FIG. 1, the intermediary section 102 includes a pair of loadlock chambers 130A, 130B and a pair of intermediate robot chambers 180A, 180B. Each of the loadlock chambers 130A, 130B is separately connected through a respective first valve 125A, 125B, at one side thereof to the front end 120, and through a respective second valve 135A, 135B, to one of the intermediate robot chambers 180A, 180B, respectively. During operation a front end robot (not shown) in the front end 120 moves a substrate therefrom into a loadlock chamber 130A or 130B, or removes a substrate from a loadlock chamber 130A, 130B. Then an intermediary robot 185A, 1856 in one of the associated intermediate robot chambers 180A, 180B connected to an associated one of the loadlock chambers 130A, 130B moves a substrate from the loadlock chamber 130A or loadlock chamber 130B and into the corresponding intermediate robot chamber 180A, 180B. In one aspect, the intermediary section 102 also includes a preclean/degas chamber 192 connected to an intermediate robot chamber 180, for example a preclean/degas chamber 192A connected to intermediate robot chamber 180A and a preclean/degas chamber 192B connected to intermediate robot chamber 1806. A substrate loaded into one of the loadlock chambers 130A, 130B from the front end 120 is moved, by the associated intermediary robot 185A or 185B, from the loadlock chamber 130A or 130B and into the preclean/degas chamber 192A or 192B. In the preclean/degas chambers 192A, 192B, the substrate is heated to volatilize any adsorbed moisture or other volatilizable materials therefrom, and is subjected to a plasma etch process whereby residual contaminant materials thereon are removed. Thereafter, the substrate is moved by the appropriate associated intermediary robot 185A or 185B back into the corresponding intermediate robot chamber 180A or 180B and thence onto a substrate support (not shown) at a process station 160 in the substrate processing chamber 150, here process station 160A or 160F. In some embodiments, once the substrate S is placed on the substrate support, it remains thereon until all processing thereof in the processing chamber 150 is completed.

Here, each of the loadlock chamber 130A and the loadlock chamber 130B is connected to a vacuum pump (not shown), for example a roughing pump, the output of which is connected to an exhaust duct (not shown), to reduce the pressure within the loadlock chamber 130A, 130B to a sub-atmospheric pressure on the order of about $10^{-3}$ torr. The loadlock chambers 130 may connect to the vacuum pump through a line that is configured to connect to the vacuum pump. Each loadlock chamber 130A or 130B may be connected to a vacuum pump dedicated thereto, or a vacuum pump shared with one or more components within the processing system 100, or to a house exhaust other than a vacuum pump to reduce the pressure therein. In each case, a valve (not shown) can be provided on the loadlock chamber 130A, 130B exhaust to the pump or house exhaust to isolate, or substantially isolate, the pumping outlet of the loadlock chamber 130A, 130B connected to the vacuum pump or house exhaust from the interior volume of the loadlock chamber 130A, 130B when the first valve 125A or 125B respectively is open and the interior of the loadlock chamber 130A, 130B is exposed to atmospheric or ambient pressure conditions.

After the substrate has been processed, for example, in the, preclean/degas chamber 192B, the intermediate robot 185B removes the substrate from the preclean/degas chamber 192B. A process chamber valve 144B, which is disposed between the intermediate robot chamber 180B and the processing chamber 150, is opened to expose a substrate transfer opening 304B (FIG. 3) formed in a wall of the processing chamber 150, and the intermediate robot 185B moves the substrate through the substrate transfer opening 304B to a process station 160F of the processing chamber 150 where it is received for processing within one or more of the process stations of the processing chamber 150. In the same manner, a substrate can be moved from the front end 120 through the loadlock chamber 130A, to the preclean/degas chamber 192A, and then to the processing chamber 150 through a process chamber valve 144A and a substrate transfer opening 304A (FIG. 3) in the processing chamber 150 wall to be received at process station 160A. Alternatively, the process chamber valves 144A, 144B may be eliminated, and intermediate robot chambers 180A, 180B be in direct uninterrupted fluid communication with the interior of the processing chamber 150

Each of the loadlock chambers 130A, 130B and intermediate robot chambers 180A, 180B are configured to pass substrates from the front end 120 into the processing chamber 150, as well as from the processing chamber 150 and into the front end 120. Thus, with respect to the first intermediate robot chamber 180A, to remove a substrate positioned at process station 160A of the processing chamber 150, the process chamber valve 144A is opened, and the intermediate robot 185A removes the substrate from the process station 160A and moves it, through an open second valve 135A connected between the intermediate robot chamber 180A and the loadlock chamber 130A, to place the substrate in the loadlock chamber 130A. The end effector of the intermediate robot 185A on which the substrate was moved is retracted from the loadlock chamber 130A, the second valve 135A thereof is closed, and the interior volume of the loadlock chamber 130A is optionally isolated from the vacuum pump connected thereto. Then the first valve 125A connected to the loadlock chamber 130A is opened, and the front end 120 robot picks up the substrate in the loadlock chamber 130A and moves it to a storage location, such as a cassette or front opening unified pod (FOUP) 110, located within or connected to a sidewall of, the front end 120. In a similar fashion, using the intermediate robot chamber 180B, the intermediary robot 185B, the loadlock chamber 130B and associated valves 135B and 125B thereof, a substrate can be moved from the process station 160F location to the front end 120. During the movement of a substrate from the processing chamber 150 to the front end 120, a different substrate may be located within the preclean/degas chamber 192A, 192B connected to the intermediate robot chamber 180A, 180B through which the substrate being moved to the front end 120 passes. Because each preclean/degas chamber 192A, 192B is isolated from the intermediate robot chamber 180A, 180B to which it is attached by a valve, passage of a different substrate can be undertaken from the processing chamber 150 to the front end 120 without interfering with the processing of a substrate in the respective preclean/degas chambers 192A, 192B.

The system controller 199 controls activities and operating parameters of the automated components found in the processing system 100. In general, the bulk of the movement of a substrate through the processing system is performed using the various automated devices disclosed herein by use of commands sent by the system controller 199. The system controller 199 is a general use computer that is used to control one or more components found in the processing system 100. The system controller 199 is generally designed to facilitate the control and automation of one or more of the processing sequences disclosed herein and typically includes a central processing unit (CPU) (not shown), memory (not shown), and support circuits (or I/O) (not shown). Software instructions and data can be coded and stored within the memory (e.g., non-transitory computer readable medium) for instructing the CPU. A program (or computer instructions) readable by the processing unit within the system controller 199 determines which tasks are performable in the processing system. For example, the non-transitory computer readable medium includes a program which when executed by the processing unit are configured to perform one or more of the methods described herein. Preferably, the program includes code to perform tasks relating to monitoring, execution and control of the movement, support, and/or positioning of a substrate along with the various process recipe tasks and various processing chamber process recipe steps being performed.

A removable central cover 190 (shown as a dashed line to illustrate underlying features) extends over a central opening 113 of a top plate 222 (FIG. 2) of the processing chamber 150. The central cover 190 is removable to allow access to the interior, a transfer region 201 (FIG. 2), of the processing chamber 150 to service a central transfer robot 145 thereof. As described in relation to FIG. 3, at least one, and in the case of the processing chamber 150, two substrate transfer openings 304A, 304B extend inwardly of an outer surface of a side wall 226 and into the transfer region 201 of the processing chamber 150. The transfer openings 304A, 304B allow the intermediary robot 185A, 185B, or the central transfer robot 145, to transfer a substrate positioned external to the processing chamber 150 to a position on a substrate support (not shown) that is positioned on a support arm 108 of the central transfer robot 145. Alternately, transfer openings 304A, 304B allow the intermediary robot 185A, 185G, or the central transfer robot 145, to remove a substrate from a substrate support (not shown) that is positioned on the support arm 108 of the central transfer robot 145.

The process stations 160 are arrayed, and are equally and circumferentially spaced from one another, along the imaginary circle 152 centered on central axis (e.g., a central axis 253 in FIG. 2A) (i.e., parallel to the Z-direction) such that the center the imaginary circle 152 is coincident with the central axis. For example, where the process station 160F is a PVD type of process station 160, the center of the PVD target overlies a portion of the imaginary circle 152, and the centers of the targets of the remaining process stations 160A-160E are equally circumferentially spaced from one another along the imaginary circle 152.

The processing chamber 150 also includes a plurality of sealing elements (e.g., O-rings) that are used to prevent atmospheric gases from entering the processing region during normal processing. The sealing elements may degrade when they reach a threshold temperature (e.g., a maximum operating temperature). For example, the sealing elements may degrade when the areas of the processing chamber 150 or the processing region contacting the sealing elements are 90° C. or more. Degradation of the sealing elements may result in a leaky seal and thus intrusion of atmospheric gases in the processing region. As a result, water and other contaminants may seep into the processing region and adversely affect the quality of the deposited film layers. The substrate processing system 100 requires maintenance, such as installation of new sealing elements, and requires cleaning of the contaminants before returning to an operational state or condition.

Processing Chamber Configuration Examples

Figure 2A:
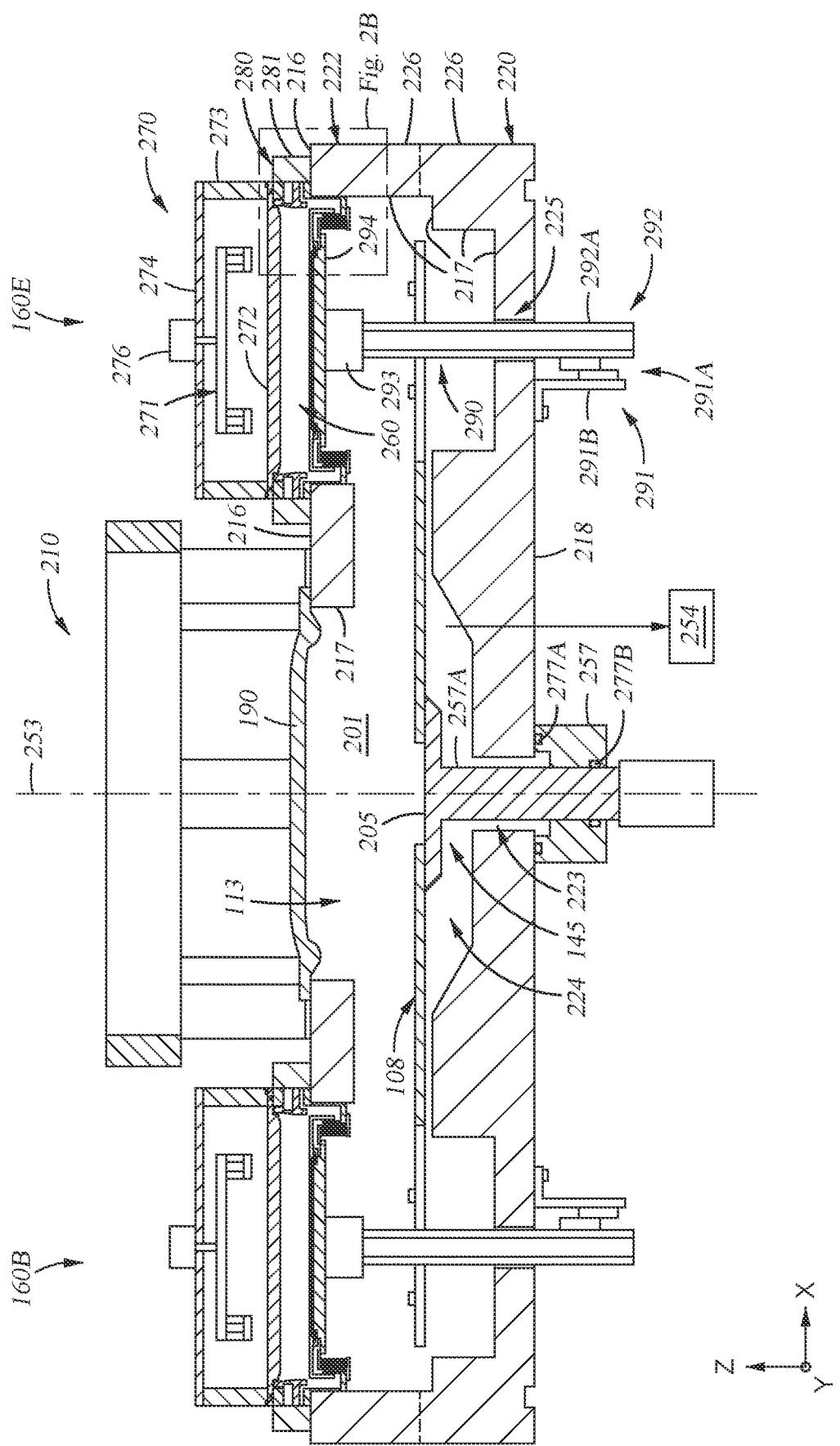
FIG. 2A is a side cross-sectional view of the processing chamber illustrated in FIG. 1, according to one or more embodiments.
Figure 2B:
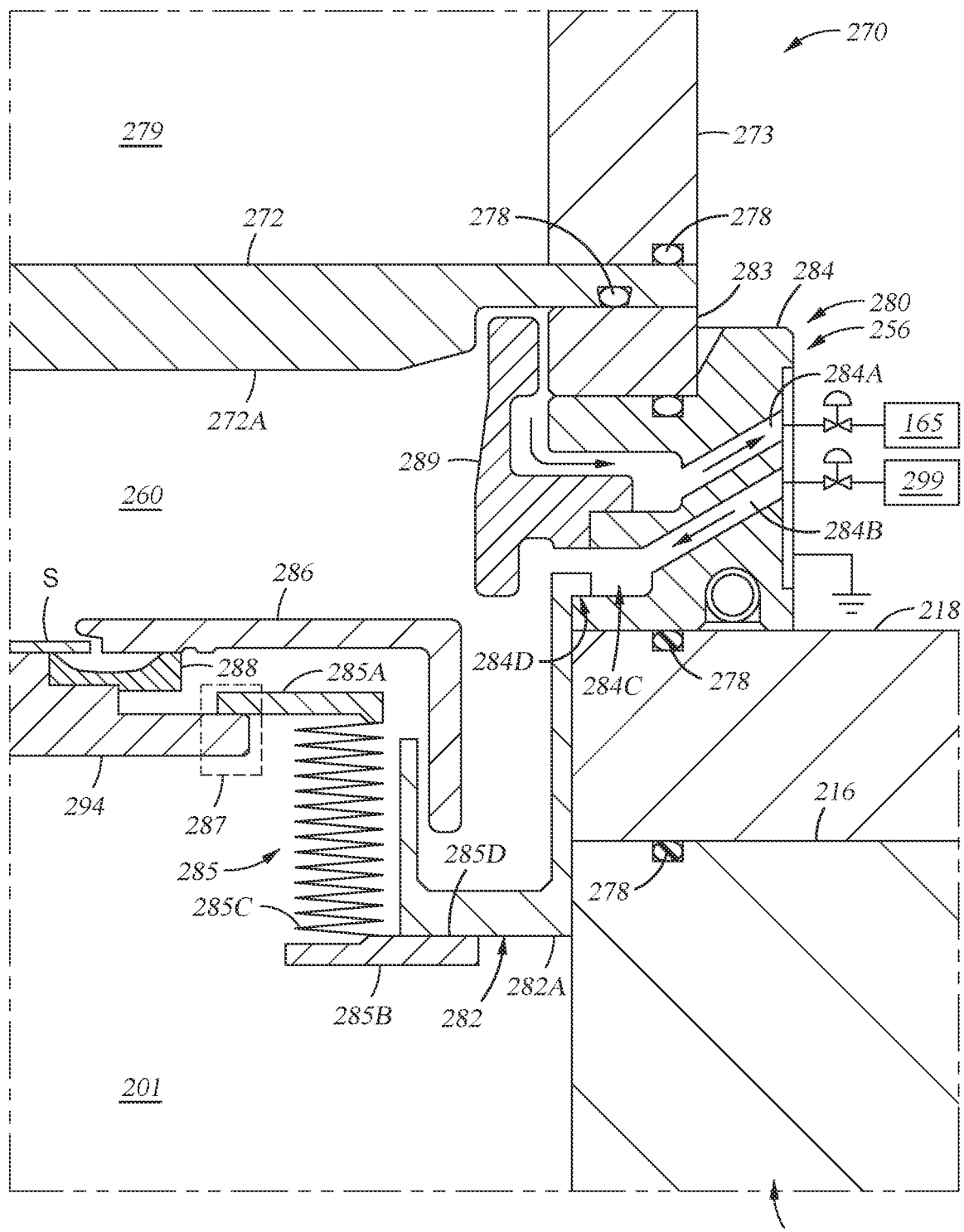
FIG. 2B is a partial cross-sectional view of a process station of the processing chamber of FIG. 2A, according to one or more embodiments.

Referring to FIGS. 2A and 2B, further details of the components within and the interior regions of a processing chamber 150 are shown. As shown in FIG. 2A, processing chamber 150 includes a bottom plate 220 forming the lower portion or base of the processing chamber 150, and a top plate 222 that is sealed thereto and supported thereon. The plates 220 and 222 include a plurality of side walls 226 formed when the top plate 222 and the bottom plate 220 are sealed. In some embodiments, bottom plate 220 and the top plate 222 are welded, brazed or fused together by some desirable means to form a vacuum tight joint at the interface between the bottom plate 220 and the top plate 222. A structural support assembly 210 is used to minimize the distortion of the plates 220 and 222 whether the processing chamber 150 is under vacuum or at ambient pressure.

The top plate 222 includes the central opening 113 disposed within a central region, and an array of upper process station openings 334 (FIG. 3), each corresponding to the location where the process stations 160 are positioned. In this configuration, the removable central cover 190 extends over the central opening 113, but is generally not coupled to or used to provide additional structural support to the processing chamber 150. The removable central cover 190 includes a sealing element (not shown) that prevents the external environmental gases from leaking into the transfer region 201 when the transfer region 201 is maintained in a vacuum state by a vacuum pump 254. The transfer region 201 may connect to the vacuum pump 254 through a line connected to the processing chamber 150 that is configured to connect to the vacuum pump 254. Inner surfaces 217 of the bottom plate 220 and the top plate 222 form an outer edge of the transfer region 201.

The removable central cover 190 extends over a central opening 113 in a top plate 222 of the processing chamber 150. The central cover 190 is removable to allow access to the interior, transfer region 201, of the processing chamber 150 to service the central transfer robot 145 thereof. At least one, and in the case of the processing chamber 150, two substrate transfer openings 304A, 304B (FIG. 3) extend inwardly of the outer surface of the side walls 226 and into the transfer region 201 of the processing chamber 150. The transfer openings 304A, 304B allow the intermediary robot 185A, 185B (FIG. 1), or the central transfer robot 145, to transfer a substrate positioned external to the processing chamber 150 to a position on a substrate support (not shown) that is positioned on a support arm 108 of the central transfer robot 145. Alternately, transfer openings 304A, 304B allow the intermediary robot 185A, 185B, or the central transfer robot 145, to remove a substrate from a substrate support (not shown) that is positioned on the support arm 108 of the central transfer robot 145. The central transfer robot 145 is a carousel type robot assembly that includes a central support 205, to which the support arms 108 are affixed, such as by threaded fasteners (not shown). The central support 205 is rotated by a carousel motor 257 positioned below the processing chamber 150, and may include a stepper motor or a servo motor that is coupled to the bottom plate 220. The bottom plate 220 includes a central opening 223 disposed within a central recess 224 disposed within a central region, and a plurality of lower process station openings 225, each corresponding to the location of a process station 160. The carousel motor 257 is connected to a drive shaft 257A that is disposed in the central opening 223 about a central axis 253, thereby rotating the support arms 108. Sealing elements 277 (e.g., O-rings) are used to prevent atmospheric gases and other contaminants from entering the transfer region 201 during normal processing. In particular, the sealing element 277A is configured to form a seal between the bottom plate 220 and the carousel motor 257 and the sealing element 277B is configured to form a seal between the carousel motor 257 and the drive shaft 257A.

The processing chamber 150 is configured to include the central transfer robot 145, from which a plurality of the support arms 108 radially extend. In some embodiments, the number of support arms 108 is equal to the number of process stations 160 of the processing chamber 150. However, the number of support arms 108 of central transfer robot 145 can be less than or greater than the number of process stations 160 of the processing chamber 150. In one embodiment, the number of support arms 108 is greater than the number of process stations 160 to allow more substrates to be transferred through the transferring region at one time and/or allow some of the support arms 108 to support additional hardware components, such as a pasting disk (not shown) that is used to perform a PVD pasting operation to remove contamination from a surface of a PVD target. A PVD pasting operation is typically performed in a process station 160 between two substrate PVD deposition processes performed in the same substrate process station 160.

In some embodiments, the side walls 226 are part the plates 220 and 222. In other embodiments, the side walls 226 are between the plates 220 and 222. In some embodiments, the bottom plate 220 comprises a bottom plurality of sides and the top plate 222 comprises a top plurality of sides. The bottom and top plurality of sides may be part of the side walls 226 (e.g., when the side walls 226 are part the plates 220 and 222) or may be part of the plates 220 and 222 (e.g., when the side walls 226 are between the plates 220 and 222), respectively.

Process Station Configuration Examples

FIGS. 2A and 2B, include cross-sectional views of portions of the process station 160E and processing chamber 150, and are intended to generally illustrate various components and attributes of a process station that can be positioned within a processing chamber 150. The reference numerals in FIG. 2A are shown on the right side of the figure, but also apply to symmetrical features on the left side. While the configuration of the process stations 160 illustrated in these figures are adapted to perform a PVD deposition process, this process station configuration is not intended to be limiting as to the scope of the disclosure provided herein, since, as noted above, one or more of the process stations 160 within a processing chamber 150 can be adapted to perform a CVD, PECVD, ALD, PEALD, etch, thermal process (e.g., RTP, anneal, cool down, thermal management control) and/or other useful semiconductor or flat display panel substrate processing step. In some embodiments, the processing chamber 150 is configured to perform a PVD process in at least one processing station 160 and at least one other type of process, such as a CVD, PECVD, ALD, PEALD, etch, or thermal process, in at least one other processing station 160.

The process stations 160 generally include a source assembly 270, a process kit assembly 280 and a substrate support actuation assembly 290, which when used together enable a desired process to be performed within a processing region 260 of the process station 160. In various embodiments of the disclosure provided herein, the processing region 260 within each of the process stations 160 is configured to be separately isolatable from the transfer region 201 of the processing chamber 150, and thus substantially prevents electromagnetic energy, vapors, gases or other undesirable contaminants from adversely affecting substrates and processes being performed in adjacent process stations or within the transfer region 201. When isolated from the transfer region 201, during a substrate processing step performed within a process station 160, the processing region 260 is generally enclosed by one or more processing surfaces of the source assembly 270, one or more processing region components 256 within the process kit assembly 280, and a support plate assembly 294. Thus, in some embodiments a chamber volume of the processing chamber 150 includes the transfer region 201 and the processing regions 260 and in other embodiments the chamber volume of the processing chamber 150 does not include the processing regions 260.

As discussed above, the source assembly 270 of the process station 160E is configured to perform a PVD process. In this configuration, the source assembly 270 includes a target 272, a magnetron assembly 471, source assembly walls 273, a lid 274 and a sputtering power supply (not shown). In this configuration, a processing surface 272A (FIG. 2B) of the PVD target 272 generally defines at least a portion of the upper portion of the processing region 260. The magnetron assembly 271 includes a magnetron region 279 (FIG. 2B) in which the magnetron is rotated by use of a magnetron rotation motor 276 during processing. The target 272 and magnetron assembly 271 are typically cooled by the delivery of a cooling fluid (e.g., deionized (DI) water) to the magnetron region 279 from a fluid recirculation device (not shown). The magnetron includes a plurality of magnets that are configured to generate magnetic fields that extend below the processing surface 272A of the target 272 to promote a sputtering process performed in the processing region 260 during a PVD deposition process.

The substrate support actuation assembly 290 includes a pedestal lift assembly 291 and a pedestal assembly 292. The pedestal lift assembly 291 includes a lift actuator assembly 291A and a lift mounting assembly 291B, which is coupled to the bottom plate 220 of the processing chamber 150. The lift actuator assembly 291A may include a stepper or servo motor actuated lead screw assembly, linear motor assembly, pneumatic cylinder actuated assembly or other conventional mechanical linear actuation mechanism. During operation the lift actuator assembly 291A and lift mounting assembly 291B are configured to position the pedestal assembly 292 in a transfer position, which is positioned vertically (Z-direction) below the support arms 108, and a processing position, which is vertically above the support arms 108 by use of one or more mechanical actuators (e.g., servo motor, stepper motor, linear motor) found within the lift actuator assembly 291A. The lift actuator assembly 291A is coupled to the pedestal shaft 292A, which is supported by bearings (not shown) that are coupled to the bottom plate 220 to guide the pedestal shaft 292A as it is translated by the lift actuator assembly 291A. A bellows assembly (not shown) is used to form a seal between the outer diameter of the pedestal shaft 292A and a portion of the bottom plate 220, such that a vacuum environment created within the transfer region 201, by use of the vacuum pump 254, is maintained during normal operation.

The pedestal assembly 292 includes the support plate assembly 294 that is coupled to plate support element 293 that is coupled to the pedestal shaft 292A. The support plate assembly 294, which is dedicated to each processing station 160, is coupled to and actuated by the lift actuator assembly 291A of the pedestal lift assembly 291. The process kit assembly 280, as shown in FIG. 2B, generally includes a plurality of processing region components 256 and a sealing assembly 285 that are positioned over and/or within the upper process station openings 334 of the top plate 222 of the processing chamber 150. In the process station 160 configuration example shown in FIG. 2B, the processing region components 256 include a base plate 281, process region shield 282, isolation ring 283, station wall 284, cover ring 286, deposition ring 288, and inner shield 289, which together at least partially define the processing region 260 of a process station 160. The base plate 281 is configured to support the process region shield 282, isolation ring 283, station wall 284, sealing assembly 285, cover ring 286, deposition ring 288, and inner shield 289, and allow these components to be positioned on and removed as one assembly from a process station opening 334 formed in the top plate 222 of the processing chamber 150. The isolation ring 283, which is formed from a dielectric material, is configured to support the target 272 and be positioned on the station wall 284 that is positioned on the base plate 281.

The process kit assembly 280 also includes a plurality of sealing elements 278 (e.g., O-rings) that are used to prevent atmospheric gases from entering the processing region 260 during normal processing. Moreover, the source assembly 270 is configured to form a seal with a portion of the process kit assembly 280 by use of a sealing element 278, and the process kit assembly 280 is configured to form a seal with an upper surface 216 of the top plate 222 similarly by use of a sealing element 278, to allow the processing region 260 to be isolated from the external environment during processing.

The station wall 284 includes a first port 284A that is coupled to the vacuum pump 165 and is configured to evacuate the processing region 260 through a circumferential gap formed between an upper portion of the shield 289, lower surface of the target 272 and portion of the isolation ring 283 and station wall 284 during processing. The station wall 284 also includes a second port 284B that is coupled to a gas source 299 through a line (not shown), and is configured to deliver one or more process gases (e.g., Ar, $N_2$) to the processing region 260 through a circumferential plenum 284C during processing.

The process region shield 282 is positioned on a lower portion of the station wall 284. The process region shield 282 is typically used to collect deposition sputtered from the target 272, enclose a portion of the processing region 260, and in some configurations, as shown in FIG. 2B, support the sealing assembly 285. In this configuration, the process region shield 282 is adapted to form a seal at a surface 284D of the station wall 284 on which it is supported, and similarly form a seal between a surface 285D of the lower plate 285B of the sealing assembly 285 and a lower surface 282A of the process region shield 282. The seals formed between the process region shield 282 and portions of station wall 284 and lower plate 285B can each be formed by use of an O-ring (not shown), welding or other conventional sealing method.

In some embodiments, the sealing assembly 285 includes an upper plate 285A, a lower plate 285B, and a compliant member 285C disposed between the upper plate 285A and lower plate 285B. In some embodiments, as shown in FIG.

2B, the compliant member 285C includes a flexible bellows assembly that is configured to be compliant in at least one direction, such as the vertical direction (i.e., Z-direction), and is configured to prevent gases from passing therethrough during processing. The flexible bellows assembly may be a stainless steel or Inconel bellows assembly that is sealably welded at opposing ends to the upper plate 285A and lower plate 285B.

During processing, when the substrate S and support plate assembly 294 are positioned in a processing position below the source assembly 270, a portion of the support plate assembly 294, or component attached thereto, both of which are referred to as a "sealing portion" of the support plate assembly 294, is adapted to form a "seal" with a portion of the sealing assembly 285 so as to substantially fluidly isolate the processing region 260 from the transfer region 201. Thus, in the process station 160 configuration example discussed with respect to FIG. 2B, the support plate assembly 294, target 272, sealing assembly 285, and plurality of processing region components 256, which include the process region shield 282, station wall 284, and isolation ring 283, substantially enclose and define the processing region 260. In some embodiments, the "seal" formed between the sealing portion of the support plate assembly 294 and the upper plate 285A of the sealing assembly 285 is created at a sealing region 287 that is formed by physical contact between a surface of the sealing portion of the support plate assembly 294 and a surface of the portion of the sealing assembly 285. In some lower temperature applications, the seal is formed by use of wiper seal, u-cup seal or an O-ring (not shown) that is positioned at the interface between the surface of the sealing portion of the support plate assembly 294 and the surface of the portion of the sealing assembly 285. In some high temperature applications, such as at temperatures greater than 200° C., the seal is formed by metal-to-metal, or metal-to-ceramic contact formed at the interface between the sealing portion of the support plate assembly 294 and the portion of the sealing assembly 285. In some embodiments, the flexible bellows assembly of the sealing assembly 285 is configured to be extended in the vertical direction as the sealing portion of the support plate assembly 294 is placed in contact with the surface of the portion of the sealing assembly 285 by use of the lift actuator assembly 291A in the substrate support actuation assembly 290.

However, in some alternate embodiments, the sealing assembly 285 simply comprises a wiper seal, u-cup seal or an O-ring (not shown) that is positioned at the interface between a sealing surface of the support plate assembly 294 and the lower surface 282A of the process region shield 282 to form a seal therebetween when the support plate assembly 294 is positioned in the processing position. In this configuration, the portion of the support plate assembly 294 on which the sealing surface is formed has a diameter that is larger than the inner diameter of the process region shield 282 so that the seal can be formed between the sealing surface and the lower surface 282A while the substrate support is positioned in the processing position during a processing step.

After performing substrate processing step(s) in a first process station 160, the substrate S and substrate support are lowered so that they are located on the support arm 108. The central transfer robot 145 then rotates the central support 205 about the central axis 253 extending therethrough to swing the support arm 108, substrate S and support plate assembly 294 through an arc to index the support plate assembly 294 and substrate S to a position below a second process station 160, where the substrate S is again lifted on the same support plate assembly 294 by a pedestal lift assembly 291, which is dedicated to that second process station 160, to the processing position. After processing is completed on the substrate S, the substrate S and support plate assembly 294 are then placed back onto the end of the support arm 108 and transferred to the next process station 160. The processing cycle of raising the substrate S and support plate assembly 294, processing the substrate S, lowering the substrate S and support plate assembly 294 and transferring the support plate assembly 294 and substrate S can then repeated multiple times.

Processing Chamber Structural Elements

Figure 3:
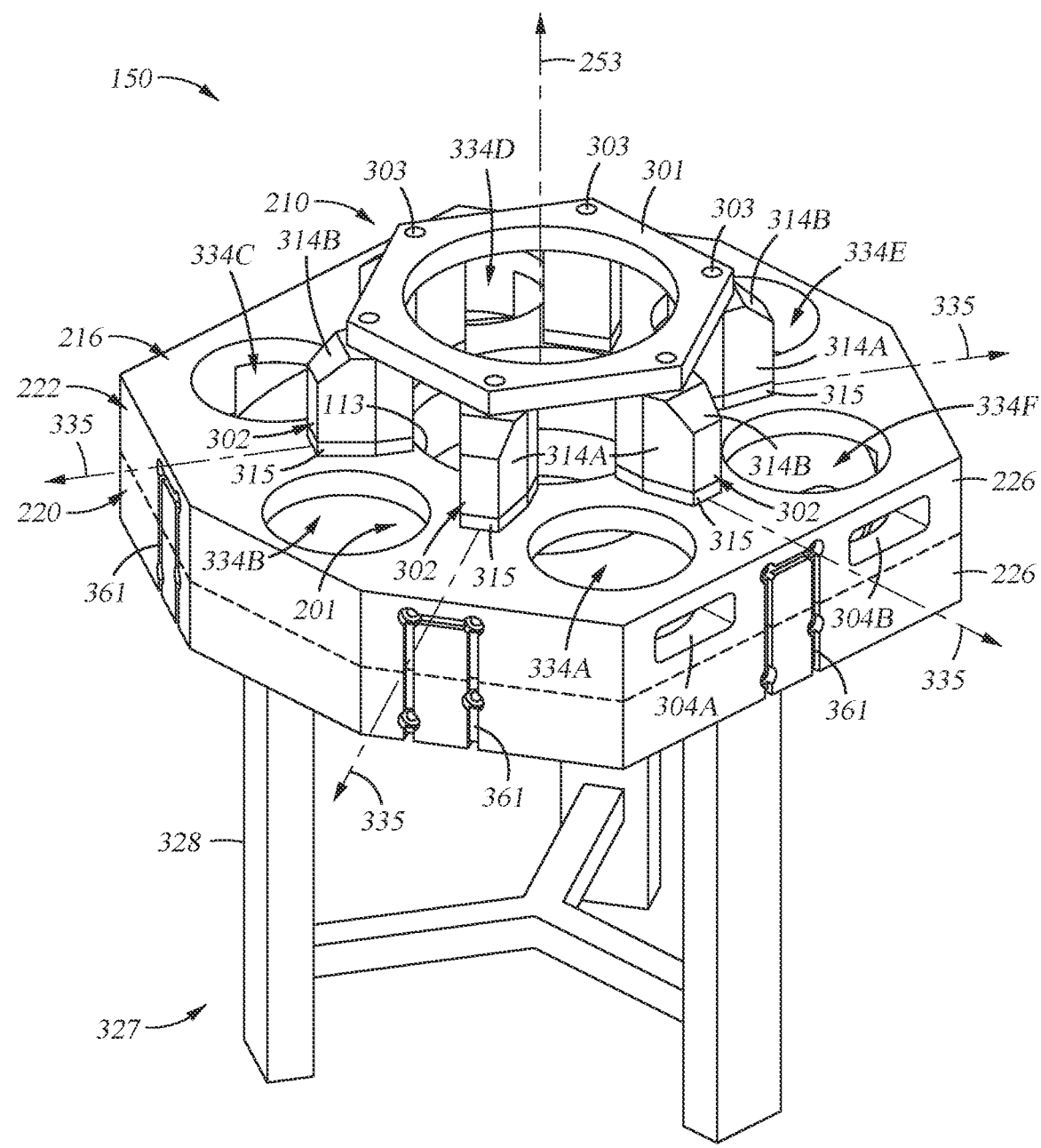
FIG. 3 is an isometric view of a processing chamber that includes a structural support assembly, according to one or more embodiments.

Referring now to FIG. 3, further structure and details of the processing chamber 150 are shown. As shown, the bottom plate 220 has a generally plate-like structure that has eight side facets. A lower supporting structure 327, which includes a support frame 328, is used to support the bottom plate 220 and the top plate 222 and position the processing chamber 150 at a desired vertical position above a floor (not shown). As shown, the top plate 222 has a generally plate like structure that has eight side facets that match those of the bottom plate 220.

The top plate 222 includes the structural support assembly 210 that includes an upper support element 301 and a plurality of mounting elements 302 that each have a first end that is coupled to the upper surface 216 of the top plate 222. In some embodiments, the first end of the mounting elements 302 are coupled to the top plate 222 by bolting, welding, or even integrally forming the mounting elements 302 as part of the top plate 222. As shown and described later in relation to FIGS. 4A and 4B, thermal breaks 315 are disposed between the mounting elements 302 and the upper surface 216 of the top plate 222. The array of mounting elements 302 are positioned on and coupled to the top plate 222 between each of the process stations 160. In some embodiments, the array of mounting elements each have a first end that is coupled to the first wall at a radial position that is positioned on a radial direction 335 that extends between two adjacent process station openings. In one example, as shown in FIG. 3, the radial position of each of the mounting elements is positioned along a radial direction 335 that extends between each pair of process station openings and are positioned at a radial position that is inboard (e.g., smaller radius extending from the central axis 253) of the upper process station openings 334. In some configurations, as shown in FIG. 3, the mounting elements 302 include a vertical section 314A and also a radial section 314B, which extends in a radial direction from the central axis 253.

In some embodiments, the upper support element 301 generally comprises a toroidal shaped structural element that is coupled to a second end of each of the mounting elements 302 to minimize the deflection of the top plate 222. As shown, in some configurations, the toroidal shape is not a perfect toroid and can include one or more facets (e.g., six facets shown) and one or more planar mounting surfaces (e.g., top and bottom surfaces). The upper support element 301 is coupled to each of the mounting elements 302 by bolting (i.e., bolts 303), welding, or even integrally forming the mounting elements 302 as part of the upper support element 301. The cross-section of the upper support element 301 includes a cross-sectional height and cross-sectional width that is configured provide a desired added stiffness to the top plate 222, due to at least to its area moment of inertia, to support the top plate 222 and counteract the applied vacuum pressure (e.g., ~14.7 psig) induced load to minimize the distortion thereof. In some embodiments, the upper support element 301 and the mounting elements 302 are formed from the same material as the material used to form the top plate 222 and bottom plate 220 components such as an aluminum material (e.g., 6061 Al).

The side walls 226 and the lower surface 218 (FIGS. 2A and 4D) of the plates 220 and 222 include grooves 361 to accommodate wiring for a plurality of heaters as later described in relation to FIG. 4A.

System for Uniform Temperature Control of Processing Chamber Examples

Figure 4A:
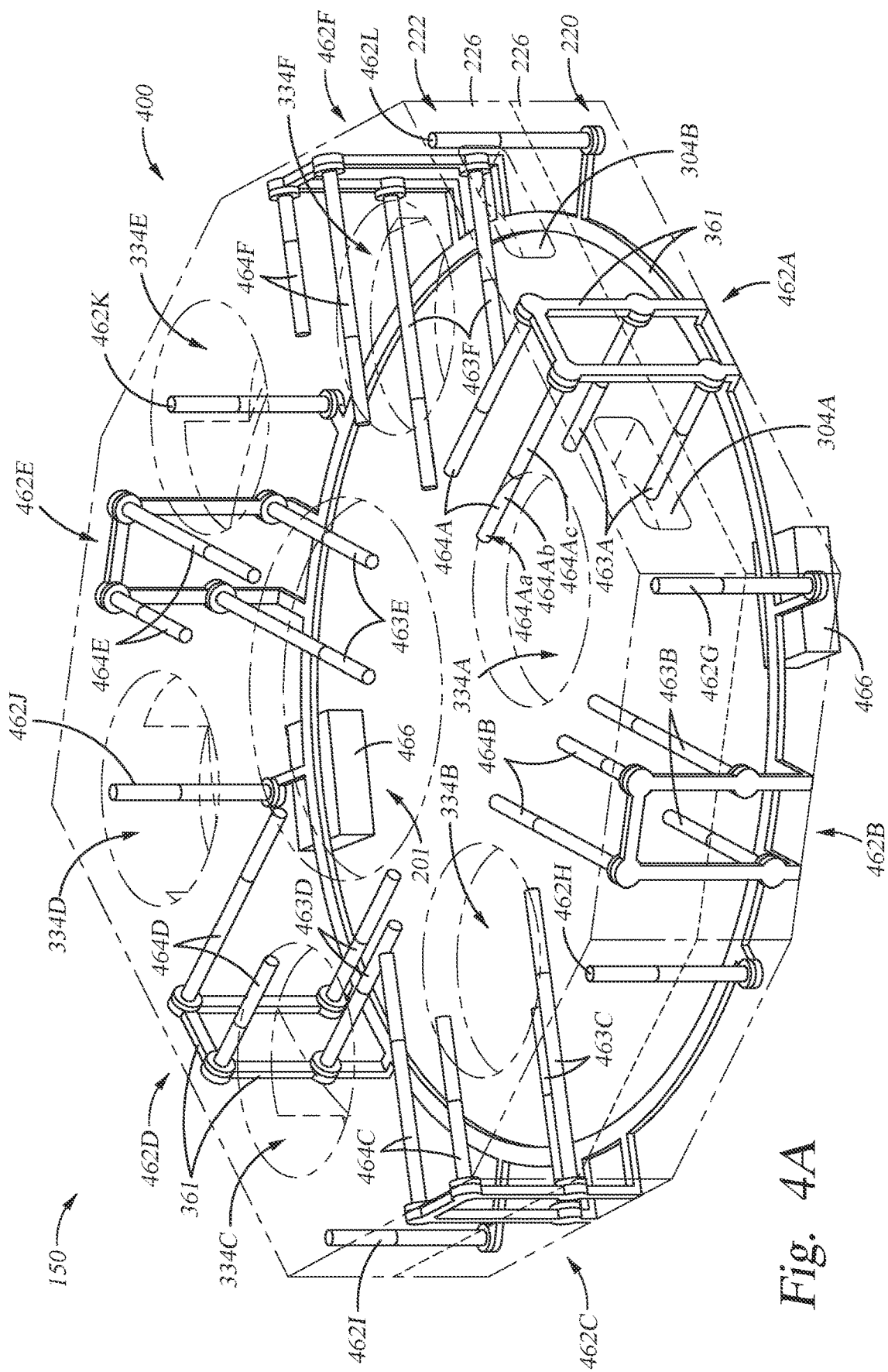
FIG. 4A is an isometric view of a processing chamber that includes a system for vaporizing and removing contaminants during a bake-out process, according to one or more embodiments.

Referring now to FIG. 4A, the processing chamber 150 includes a system 400 for vaporizing and removing contaminants during a bake-out process. As shown, the system 400 includes a plurality of heaters 462 disposed in the processing chamber 150 and configured to raise the temperature inside of the chamber volume (e.g., the transfer region 201 and the processing region 260) of the processing chamber 150. During the bake-out process, the processing chamber 150 is sealed, the temperature is raised to vaporize the contaminants, and the vacuum pump 254 connected to the transfer region 201 removes the vaporized contaminants from inside the chamber volume. However, because the processing chamber 150 varies in dimensions and material thickness, and various structures (e.g., the structural support assembly 210, the lower supporting structure 327, and the at least one intermediary section 102 (FIG. 1)) connect to the processing chamber 150, the plurality of heaters 462 may heat different areas of the processing chamber 150 and the chamber volume at different rates. For example, the at least one intermediary section 102 and the structural support assembly 210 act as a heat sink and draw heat away from the top plate 222. Thicker cross-sections of the plates 220 and 222 may take longer to heat than thinner cross-sections. Thus, different types of heaters 462 and/or variable or independently controlled heaters 462 are needed to compensate for the heat loss and different heating rates.

As shown, the plurality of heaters 462 includes heater assemblies 462A-462F, which are disposed in the plates 220 and 222. Each heater of the plurality of heaters 462 includes a heating portion and a sheath portion. For example, a heater 464Ac is a cylindrical shape and includes a heating element 464Ab and a sheath 464Ac. The sheath 464Ac beneficially allows the heating element 464Ab to be positioned further away from the side walls 226 of the plates 220 and 222. The heater assemblies 462 raise the temperature inside of the chamber volume by heating up the surrounding material of the plates 220 and 222. Each heater assembly 462A-462F includes four heaters split between the plates 220 and 222. For example, the heater assembly 462A includes a lower pair 463A of heaters disposed in the bottom plate 220 and an upper pair 464A of heaters disposed in the top plate 222. Each of the upper pairs 464A-464F of heaters are positioned between the upper process station openings 334A-334F of top plate 222. For example, the upper pair 464A is disposed between the openings 334A and 334F. Each lower pair 463A-463F is positioned in the bottom plate 220 and in-line with the corresponding upper pair 464A-464F, respectively. The pairs 463A-463F and 464A-464F are evenly distributed throughout the plates 220 and 222, which beneficially ensures consistent heating of the chamber volume. The lower pairs 463 may be referred to as a plurality of lower heaters and the upper pairs 464 may be referred to as a plurality of upper heaters.

As shown, the plurality of heaters 462 further include corner heaters 462G-462L, which are disposed in corners of the plates 220 and 222. For example, a corner heater 462G is positioned in a corner where two of the side walls 226 (FIG. 3) meet, near the opening 334A. The corner heaters 462G-462L heat corners of the processing chamber 150 and beneficially ensure consistent heating of the chamber volume. The corner heaters 462G-462L raise the temperature inside of the chamber volume by heating up the surrounding plates 220 and 222. In some embodiments, the corner heaters 462G-462L heat only the top plate 222. In some embodiments, the corner heaters 462G-462L heat only the bottom plate 220. Some embodiments of the system 400 do not include the corner heaters 462G-462L.

Figure 4B:
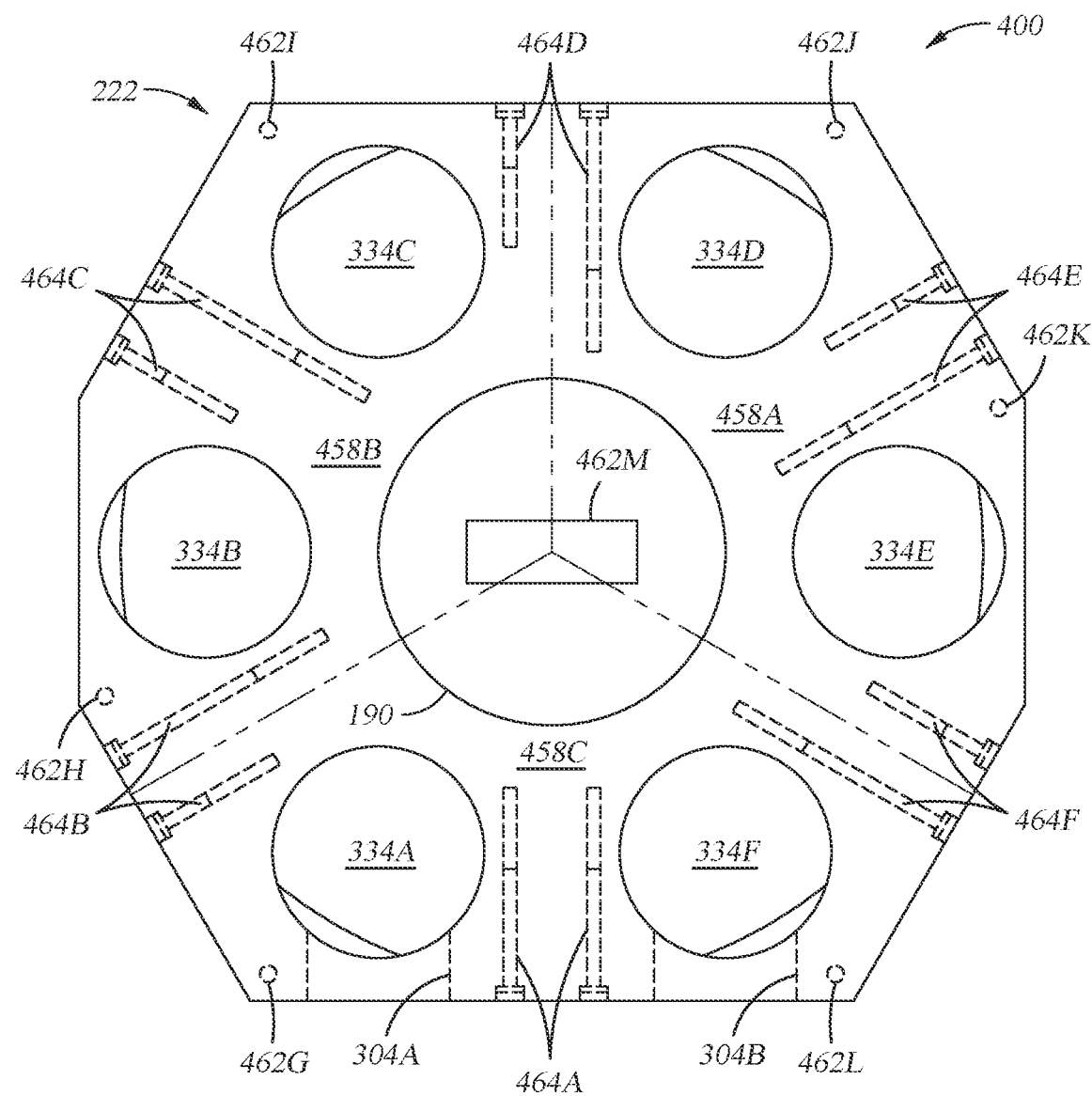
FIG. 4B is a top view of the processing chamber from FIG. 4A illustrating different regions for controlling upper pairs of heaters of the system for vaporizing and removing contaminants during a bake-out process, according to one or more embodiments.
Figure 4C:
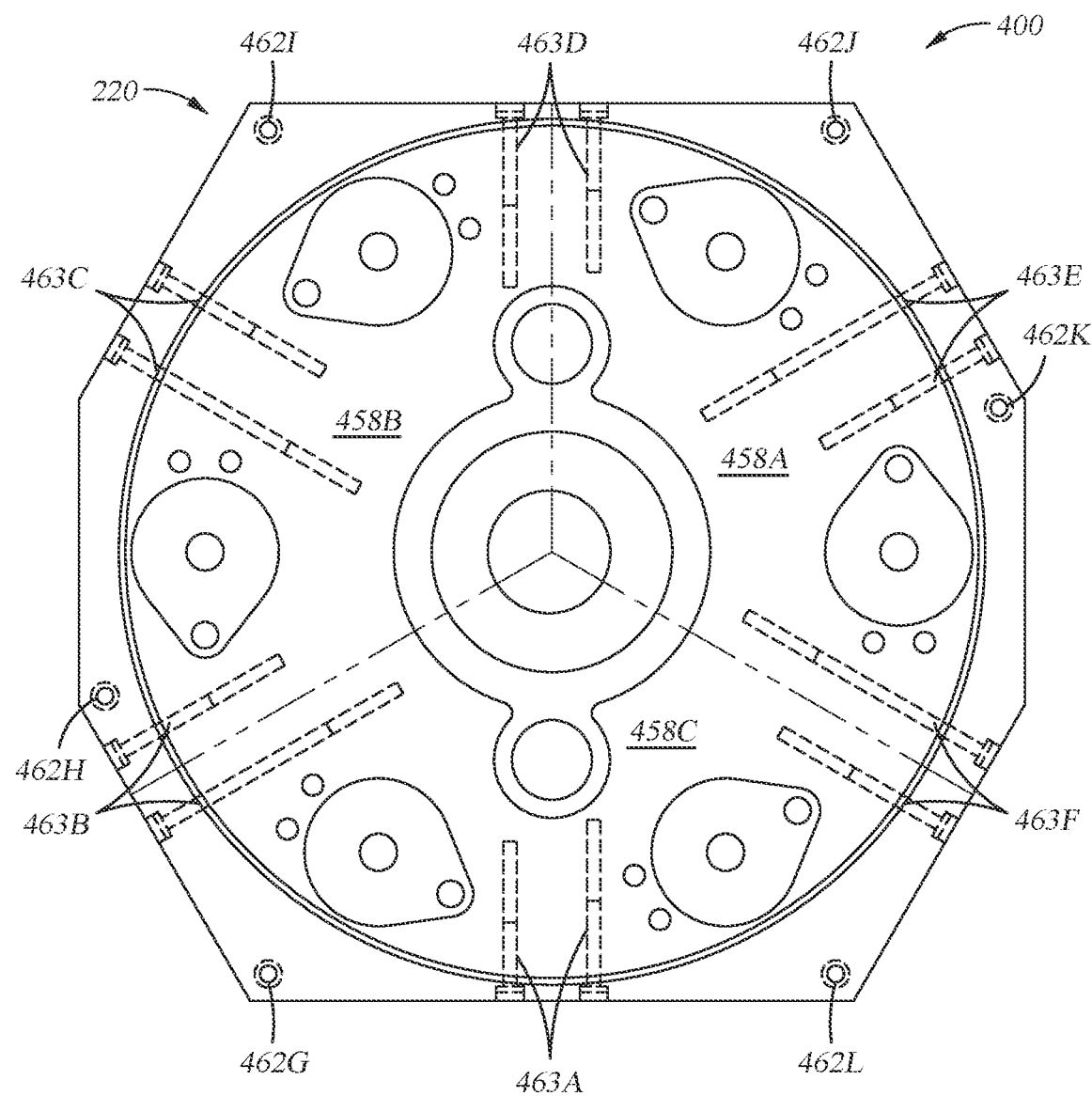
FIG. 4C is a top view of a lower plate of the processing chamber from FIG. 4A illustrating different regions for controlling lower pairs of heaters of the system for vaporizing and removing contaminants during a bake-out process, according to one or more embodiments.

Each heater of the plurality of heaters 462 or of the pairs 463 and 464 may be of a different type. As shown in FIGS. 4A-4C, each of the lower pairs 463A-463F and each of the upper pairs 464B-464F have heaters of different lengths. This beneficially allows the heating elements of each heater to be positioned inside the plates 220 and 222 at different distances from the side walls 226 and further away from the sealing elements 277 and 278 (FIGS. 2A and 2B), which beneficially ensures the temperature of the sealing elements 277 and 278 remain under the maximum operating temperature during the bake-out process. The lower pairs 463 of heaters may be of a higher wattage than the upper pairs 464. Each heater of the plurality of heaters 462 may be independently controlled, for example, by the system controller 199. For example, the plurality of heaters 462 are configured in and controlled by a plurality of regions or zones as later described in relation to FIG. 4B.

As shown, the plurality of heaters 462 are embedded in the plates 220 and 222 such that none of the plurality of heaters 462 are disposed in the chamber volume or extend into the chamber volume. Thus, the plurality of heaters 462 heat the inside of the processing chamber 150 (e.g., the chamber volume) through conductive heat transfer. For example, blind holes may be drilled in the plates 220 and 222 to accommodate the plurality of heaters 462. There may be an interference fit between the blind holes and the plurality of heaters 462. This beneficially encourages heat transfer and prevents a need to seal the processing chamber 150 around the plurality of heaters 462 when forming a vacuum inside the processing chamber. In some embodiments, a conductive paste may be used to improve thermal contact between the plates 220 and 222 and the plurality of heaters 462.

In other embodiments, the plurality of heaters 462 are disposed inside the chamber volume adjacent to the plates 220 and 222 and thus heat the chamber volume through radiative heat transfer. In such embodiments, at least a portion of the plurality of heaters 462 may penetrate the side walls 226 (FIG. 2) and extend therefrom. The at least a portion of the plurality of heaters 462 further include sealing elements (not shown) that form a seal between the portion of the plurality of heaters 462 and the side walls 226 and maintain the vacuum state inside the chamber volume. In other embodiments, a first portion of the plurality of heaters 462 (e.g., the heater assemblies 462A-462F) are disposed inside the chamber volume adjacent to the plates 220 and 222 and a second portion of the plurality of heaters 462 (e.g., the corner heaters 462G-462L) are disposed inside the chamber volume parallel to the central axis 253 (FIG. 2). Each of the heaters in the first and second portions of heaters includes a sealing element to form a seal between the heater and the side wall 226 or the bottom plate 220 as previously described.

Although the plurality of heaters 462 are shown as a cylindrical shape having the heating element and the sheath, in other embodiments the configuration may differ. For example, the heaters may be a rectangular or triangle shape or the sheath may not be included. The heating elements may extend inward starting from the side walls 226.

Although the plurality of heaters 462 are shown in the pairs 463 and 464, in other embodiments more or less heaters and other configurations may be used. In some embodiments, the plurality of heaters 462 includes cartridge heaters manufactured by Watlow®. In some embodiments, the cartridge heaters includes FIREROD® cartridge heaters manufactured by Watlow®. In some embodiments, each heater of the plurality of heaters 462 may be of a different wattage. In some embodiments, the heating capacity of the plurality of heaters 462 is about 4-5 Watt/lbm.

Referring now to FIGS. 4B and 4C, the processing chamber 150 includes a plurality of regions 458 for controlling the plurality of heaters 462. In particular, FIG. 4B shows a top view of the processing chamber 150 with a see-thru view of the upper pairs 464 of heaters. FIG. 4C shows a top view of the bottom plate 220 and a see-thru view of the lower pairs 463 of heaters.

As shown, the plurality of regions 458 are demarcated by dashed lines. A first region 458A includes a half of the heater assembly 462F (e.g., one upper heater and one lower heater), the heater assembly 462E, and a half of the heater assembly 462D; a second region 458B includes the other half of the heater assembly 462D, the heater assembly 462C, and a half of the heater assembly 462B; and a third region 458C includes the other half of heater assembly 462B, heater assembly 462A, and the other half of the heater assembly 462F. The first region 458A further includes corner heaters 462J and 462K, the second region 458B further includes 462H and 462I, and the third region 458C further includes corner heaters 462G and 462L. The plurality of heaters 462 may be controlled independently according to each region 458A-458C of the plurality of regions 458 as discussed in relation to FIG. 4D. As previously discussed, the heaters of the pairs 463 and 464 may be of a different type. For example, the heaters of the pairs 463 are 1,000 W and the heaters of the pairs 464 and corner heaters 462G-462L are 600 W. In other embodiments, the regions 458A-458C may be configured differently. For example, the regions 458A-458C may not include the corner heaters 462G-462L.

As further shown in FIGS. 4A and 4B, each of the upper pairs 464B-464F of heaters have two heaters of different lengths, while the two heaters of upper pair 464A are the same length. The heaters of the upper pairs 464B-464F follow a pattern of length of shorter-longer-shorter-longer-longer-shorter-shorter-longer-shorter-longer starting from the upper pair 464B and going clockwise to upper pair 464F. This beneficially positions the heating elements of the plurality of heaters 462 at different locations and prevents buildup of heat between the process station openings 334 of the top plate 222.

As shown in FIGS. 4A and 4C, each of the lower pairs 463A-463F have two heaters of different lengths. The heaters of the lower pairs 463B-463F generally follow a pattern of length that is opposite from the upper pairs 464B-464F. For example, going clockwise, the pattern of the upper pair 464F is shorter-longer while the lower pair 463F is longer-shorter. This opposite configuration beneficially reduces the amount of localized hot and cold spots in the processing chamber 150 and the chamber volume. However, not all of the lower pairs 463 are opposite from the upper pairs 464. For example, the lower pair 463D follows the same longer-shorter configuration as the upper pair 464D. The heaters of the upper pair 464A are the same length while the heaters of the lower pair 463A follow the longer-shorter configuration.

The plurality of regions 458 and the different types of heaters in the pairs 463 and 464 allow the system 400 to account for the different heating rates of the processing chamber 150. As shown in FIGS. 4B and 4C, the third region 458C includes a side wall 226 (FIG. 3) of the processing chamber 150 that is coupled the intermediary section 102 (FIG. 1). As discussed in relation to FIG. 4A, the intermediary section 102 may act as a heat sink and draw heat away from the processing chamber 150. Thus, the independent control of the plurality of regions 458 beneficially allows a portion of the plurality of heaters 462 that are disposed in region 458C to receive more power than the remaining plurality of heaters 462 to compensate for the heat loss, as further discussed in relation to FIG. 4D. Additionally, the heaters of the upper pair 464A are the same length to compensate for the heat loss to the intermediary section 102.

As previously discussed in relation to FIG. 4A, each heater of the pairs 463 and 464 may be of a different type. Thus, the heaters in the lower pairs 463 may include a first heater type and a second heater type while the heaters in the upper pairs 464 may include a third heater type and a fourth heater type, where each heater type may be somehow different from the other heater types (e.g., in length or wattage). For example, the first heater type extends further in inward towards the central opening 223 than the second heater type and the fourth heater type extends further in inward towards the central opening 223 than the third heater type. Stated differently, the first heater type is a first length and the second heater type is a second length, where the first length is greater than the second length. The third heater type is a third length and the fourth heater type is a fourth length, where the fourth length is greater than the third length. The first and second heater types may be of a first wattage and the third and fourth heater types may be of a second wattage, where the first wattage is greater than the second wattage. The heater types of the pairs 463 and 464 may alternate, for example in length, as previously described.

Although different types and configurations of the heaters of the pairs 463 and 464 are presented, other types and configurations are contemplated. For example, one pair of the upper pairs 464 may be of a fifth heater type, where the fifth heater type may be the same as the third or fourth heater types. Thus, the remaining pairs of the upper pairs 464 may alternate, for example in length. Additionally, any of the pairs 463 and 464 may include at least one heater of a different type than the other heaters.

The different heater configurations and regions disclosed are not meant to be limiting and other configurations may be used. The layout of the heaters may be optimized to the geometry and configuration of the processing chamber. As shown, the plurality of heaters 462 are positioned and configured to account for surrounding features, such as thru-holes and recesses, of the processing chamber 150.

Figure 4D:
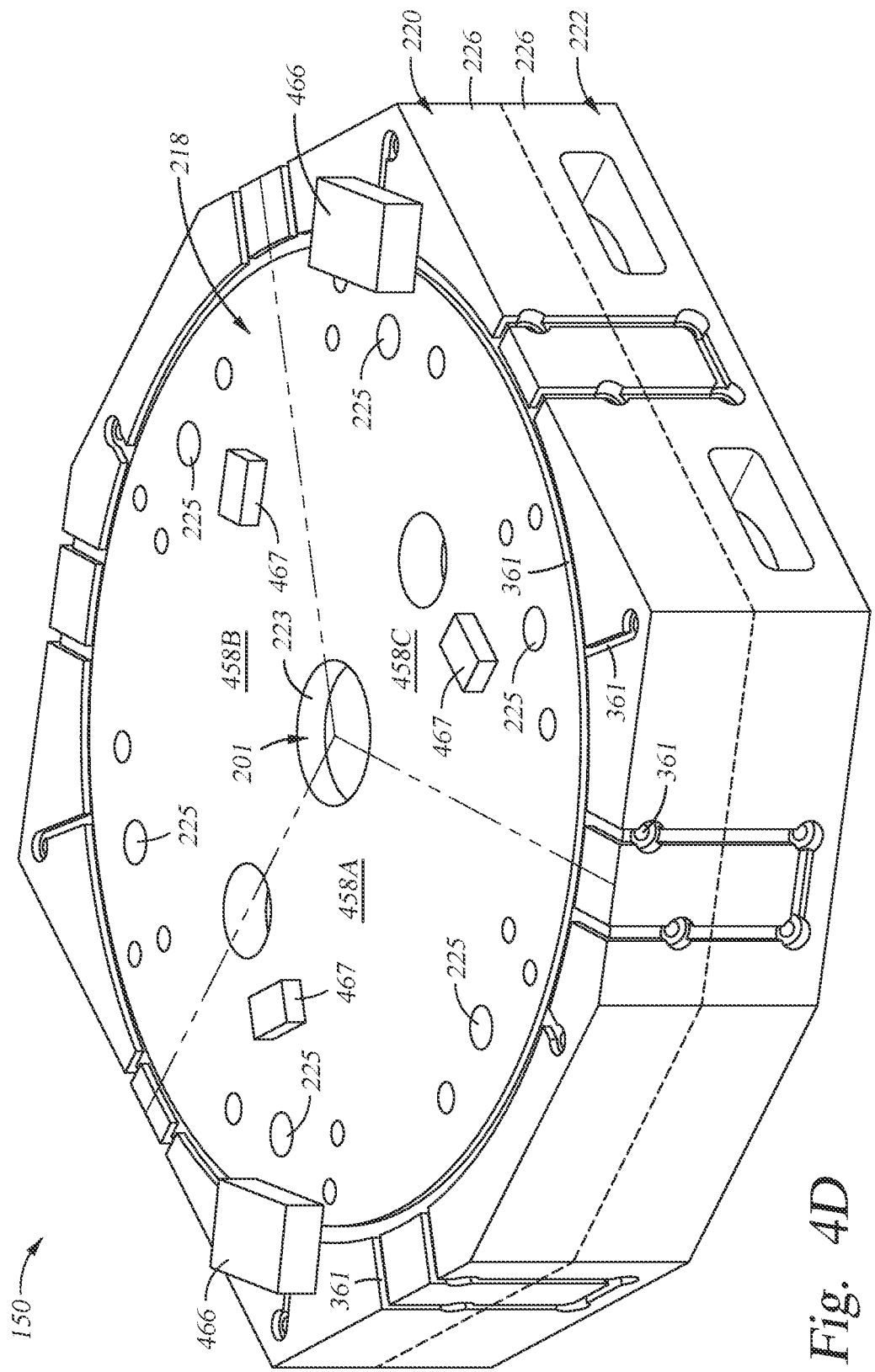
FIG. 4D is an isometric view of the bottom of the processing chamber from FIG. 4A, according to one or more embodiments.

Referring now to FIG. 4D, each region 458A-458C has a thermal cutoff switch 467 (e.g., a thermostat or a thermocouple) connected to the lower surface 218 to sense and control the temperature of the region. The plurality of heaters 462 connect to the thermal cutoff switches 467 and a power supply (not shown) at thermal bake-out boxes 466. The plates 220 and 222 include grooves 361 for running wires to connect the plurality of heaters 462 and the thermal cutoff switches 467 to the bake-out boxes 466. In some embodiments, the system controller 199 connects to the plurality of heaters 462, the power supply, and the thermal cutoff switches 467 at the thermal bake-out boxes 466 and controls the temperature of each region by controlling the power to the heaters. For example, the system controller is configured to control power to the heaters such that a temperature in each region is maintained between a minimum operating temperature and a maximum operating temperature during the bake-out process. Thus, the system controller is configured to provide a plurality of heaters in one of the regions with more power than a different plurality of heaters in the other regions. In some embodiments, the system controller 199 includes the thermal cutoff switches 467. As shown, the thermal cutoff switches 467 control the plurality of heaters 462 based on the temperature in each region. For example, the heaters of a region are turned on until the temperature reaches 93° C. The heaters are then turned off until the temperature reaches 83° C. This cycle repeats until the inside of the chamber is cleaned. In other examples, the minimum operating temperature is 80° C.

As previously discussed, various structures connect to the processing chamber 150 that act as a heat sink. Thermal breaks are used to isolate the processing chamber 150 from these connected structures. For example, as shown in FIG. 3, thermal breaks 315 may isolate each mounting element 302 of the structural support assembly 210 from the top plate 222. For example, thermal breaks (not shown) are used to isolate the support frame 328 from the bottom plate 220. For example, thermal breaks (not shown) are used to isolate the intermediary section 102 (FIG. 1) from the processing chamber 150. The thermal breaks may be made from a material with a low thermal conductivity to choke the heat from processing chamber 150. The thermal break material has a high compressive strength to withstand the high pretension of bolts when installed (e.g., the bolts securing the support frame 328 to the top plate 222). In some embodiments, the material of the thermal break is a ceramic. In some embodiments, the material of the thermal break is synthetic mica.

The thermal breaks and the different assemblies, positions, configurations, and regions of the plurality of heaters 462 allow the inside of the processing chamber 150 to be evenly heated. For example, the temperature differential between a maximum and minimum temperature of the bottom plate 220 or of the top plate 222 is controlled to be about 10° C. during the bake-out process. This beneficially ensures the temperature of the sealing elements remain under the maximum operating temperature during the bake-out process. In some embodiments, the maximum and minimum temperature is about 80° C. and about 90° C., respectively. Heating the processing chamber 150 through the plurality of regions 458 further allows the processing chamber 150 to quickly reach a predetermined temperature (e.g., a threshold temperature) and allows for more time for stabilization of the temperature.

In some embodiments, the thermal cutoff switches 467 sense the temperature of the lower surface 218. In some embodiments, the thermal cutoff switches 467 sense the temperature of the inner surfaces 217 (FIG. 2A) by, for example, having a sensor disposed in the plates 220 and/or 222 or inside the transfer region 201. Although FIGS. 4A-4D discuss connecting various elements (e.g., the plurality of heaters 462, the bake-out boxes 466 and the thermal cutoff switches 467) through wires, in other embodiments at least some of the elements communicate wirelessly.

In some embodiments, the plurality of heaters 462 includes additional heaters. For example, at least one surface heater 462M is used on the central cover 190. The plates 220 and 222 may also use surface heaters at different locations (not shown), such as on the lower surface 218 (FIG. 2) and in particular surrounding the central opening 223. The surface heaters may be controlled according to the plurality of regions 458A-458C or according to an additional region or regions. This beneficially helps remove cold spots and ensures the temperature remains within pre-determined limits during the bake-out process.

Figure 5:
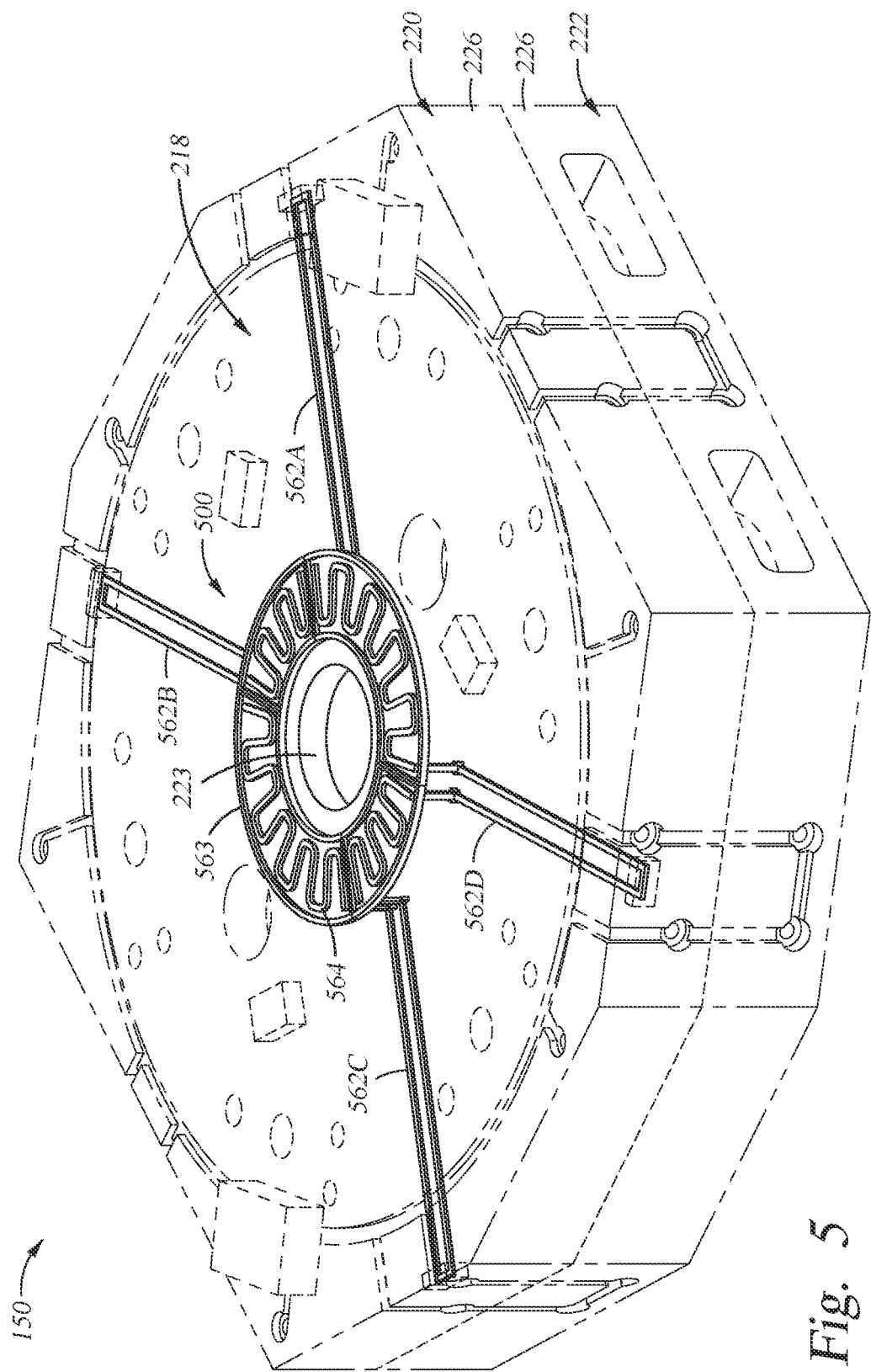
FIG. 5 is an isometric view of a cooling system on a bottom of a processing chamber, according to one or more embodiments.

In some embodiments, as described in relation to FIG. 5, the processing chamber 150 is cooled to an operating temperature after the bake-out process by a cooling system. This beneficially reduces the time required to return the substrate processing system to an operable state or condition where substrates can be processed as previously described in relation to FIG. 1.

System to Cool Processing Chamber Examples

Referring now to FIG. 5, the processing chamber 150 further includes a cooling system 500 for cooling the processing chamber 150 after the bake-out. As shown, the cooling system 500 includes a cooling plate 563 connected to a lower surface 218 of the bottom plate 220 which surrounds the central opening 223. The cooling plate 563 includes cooling channels 564 that alternate in an out-and-back pattern, alternating in directions between the central opening 223 and the side walls 226 of the bottom plate 220 as they surround the central opening 223. The cooling system further includes a plurality of cooling channels 562 disposed in the bottom plate 220. The plurality of cooling channels 562 are arranged in pairs 562A-562D. Each pair 562A-562D is fluidly coupled to the cooling channels 564 and extends from the central opening 223 of the bottom plate 220 towards the side walls 226 of the bottom plate 220 and then returns to the cooling towards the central opening 223.

The cooling channels 562 and 564 are configured to connect to a cooling fluid recirculation device (not shown). The cooling channels 562 and 564 are further configured to have a coolant pumped through to cool the lower plate 220 and thus the processing chamber 150. In certain embodiments, the system controller 199 controls the cooling rate of the cooling system 500 by controlling the cooling fluid recirculation device and the flow of coolant. The system controller 199 may interface with at least one temperature sensor connected to the processing chamber 150 to determine the temperature. In other embodiments, the thermal cutoff switches 467 (FIG. 4D) control the cooling system 500. In other embodiments, the cooling system 500 is configured to be turned on and off manually by a user.

In some embodiments, the operating temperature is about 50° C. In some embodiments, the coolant includes water, DI water, or glycol. In some embodiments, the coolant flows through the cooling system 500 at about 5 GPM.

In some embodiments, the cooling system 500 is used during the bake-out process. For example, the cooling system 500 is used during an initial temperature ramp-up to beneficially ensure the temperature of each region does not exceed a threshold temperature.

Although the cooling system 500 is described with respect to the bottom plate 220, in some embodiments the cooling system is used with the top plate 222.

Controller for Bake-Out Process of Processing Chamber Examples

Figure 6:
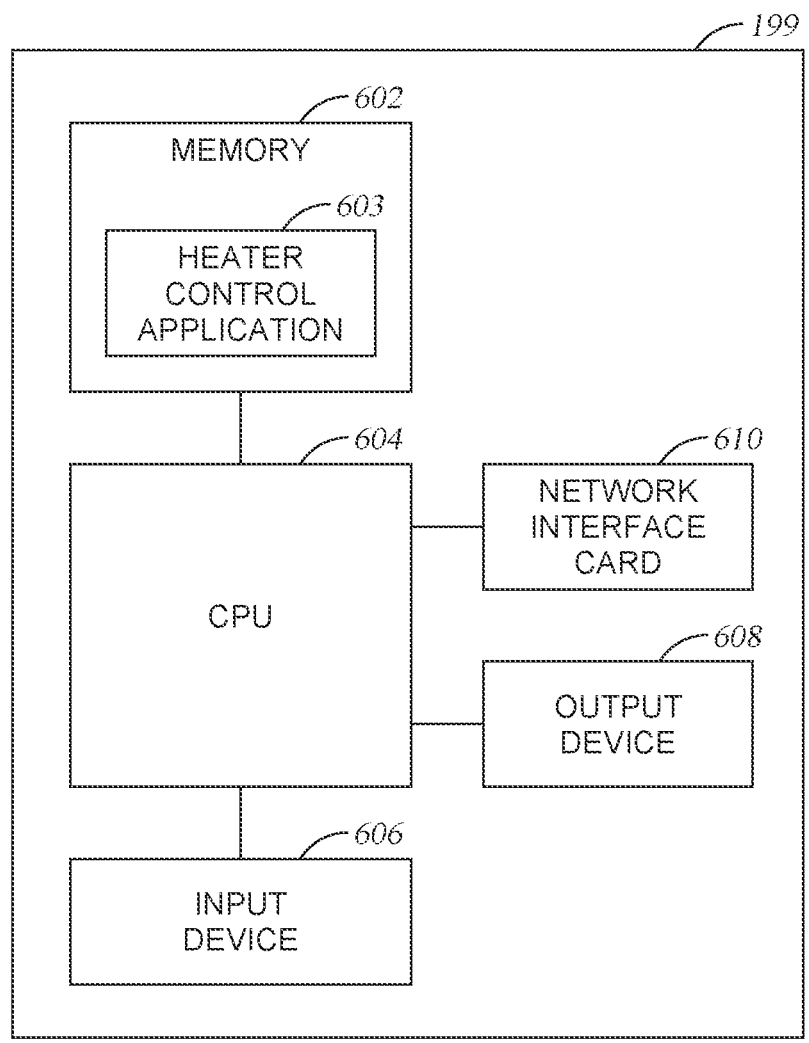
FIG. 6 depicts an example of a functional block diagram of a controller for heaters of the system for vaporizing and removing contaminants during a bake-out process or a cooling system, according to embodiments described herein.

FIG. 6 depicts a functional block diagram of one example of a system controller 199 for a plurality of heaters (e.g., the plurality of heaters 462 in FIG. 4A) and/or a cooling system (e.g., the cooling system 500 in FIG. 5). The system controller 199 includes a processor 604 (e.g., a central processing unit (CPU)) in data communication with a memory 602, an input device 606, and an output device 608. In some embodiments, the processor 604 is further in data communication with an optional network interface card 610. Although described separately, it is to be appreciated that functional blocks described with respect to the system controller 199 need not be separate structural elements. For example, the processor 604 and memory 602 is embodied in a single chip. The processor 604 can be a general purpose processor, a digital signal processor ("DSP"), an application specific integrated circuit ("ASIC"), a field programmable gate array ("FPGA") or other programmable logic device, discrete gate or transistor logic, discrete hardware components, or any suitable combination thereof designed to perform the functions described herein. A processor may also be implemented as a combination of computing devices, e.g., a combination of a DSP and a microprocessor, a plurality of microprocessors, one or more microprocessors in conjunction with a DSP core, or any other such configuration.

The processor 604 can be coupled, via one or more buses, to read information from or write information to memory 602. The processor may additionally, or in the alternative, contain memory, such as processor registers. The memory 602 can include processor cache, including a multi-level hierarchical cache in which different levels have different capacities and access speeds. The memory 602 can also include random access memory (RAM), other volatile storage devices, or non-volatile storage devices. The storage can include hard drives, flash memory, etc. Memory 602 can also include a heater control application 603 which is used to control the plurality of heaters 462 as described in FIG. 4D. Heater control application 603 may be code that can be executed by processor 604. In various instances, the memory is referred to as a computer-readable storage medium. The computer-readable storage medium is a non-transitory device capable of storing information, and is distinguishable from computer-readable transmission media such as electronic transitory signals capable of carrying information from one location to another. The non-transitory computer readable medium includes computer-executable instructions that, when executed by a processing system, cause the processing system to perform a method, as described in relation to FIG. 4D, including: (a) heating each region with a portion of the plurality of heaters in the region until a thermal cutoff switch of the plurality of thermal cutoff switches senses the maximum operating temperature, (b) turning off the plurality of heaters in the region until the thermal cutoff of the plurality of thermal cutoff switches switch senses the minimum operating temperature; and (c) repeating (a) and (b) at least one more time. Computer-readable medium as described herein may generally refer to a computer-readable storage medium or computer-readable transmission medium.

The processor 604 also may be coupled to an input device 606 and an output device 608 for, respectively, receiving input from and providing output to a user of the system controller 199. Suitable input devices include, but are not limited to, a keyboard, buttons, keys, switches, a pointing device, a mouse, a joystick, a remote control, an infrared detector, a bar code reader, a scanner, a video camera (possibly coupled with video processing software to, e.g., detect hand gestures or facial gestures), a motion detector, or a microphone (possibly coupled to audio processing software to, e.g., detect voice commands). The input device 606 includes a thermal cutoff switch as discussed in relation to FIG. 4D. Suitable output devices include, but are not limited to, the plurality of heaters 462 as discussed in relation to FIG. 4A as well as visual output devices, including displays and printers, audio output devices, including speakers, headphones, earphones, and alarms, additive manufacturing machines, and haptic output devices. As discussed in relation to FIGS. 4A-4D, the output device 608 includes various electrical components that are configured to drive and control a mechanism or motor that is used to control the power supplied to the plurality of heaters 462 in each region 458.

Aspects of the present disclosure been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A substrate processing system, comprising:
   a processing chamber comprising:
      a top plate having an array of process station openings disposed therethrough surrounding a central axis, wherein the top plate comprises a top plurality of sides;
      a bottom plate having a first central opening, wherein the bottom plate comprises a bottom plurality of sides; and
      a plurality of side walls between the top plate and the bottom plate;
   a plurality of heaters disposed in the top plate and the bottom plate and configured in a plurality of regions, wherein the plurality of heaters comprises a plurality of upper pairs of heaters disposed in the top plurality of sides and a plurality of lower pairs of heaters disposed in the bottom plurality of sides, wherein the upper pairs of heaters are disposed between adjacent openings of the array of process station openings;
   a cooling plate surrounding the first central opening having a first cooling channel disposed in the cooling plate;
   at least one second cooling channel disposed in the bottom plate, wherein the at least one second cooling channel is fluidly coupled to the first cooling channel and extends towards at least one side of the bottom plurality of sides; and
   a system controller configured to independently control the plurality of heaters in each region in the top plate and the bottom plate.

2. The substrate processing system of claim 1, wherein:
   the lower pairs of heaters comprise a first heater and a second heater, and
   the upper pairs of heaters comprise a third heater and a fourth heater, wherein the first heater extends further inward towards the first central opening than the second heater and the fourth heater extends further inward towards the first central opening than the third heater.

3. The substrate processing system of claim 1, further comprising at least one surface heater connected to the processing chamber.

4. The substrate processing system of claim 1, wherein:
   the top plate further has a second central opening on the central axis; and
   the substrate processing system further comprises:

a central cover disposed over the second central opening and removably attached to the top plate, and
at least one surface heater connected to the central cover.

5. The substrate processing system of claim 1, further comprising a structural support assembly coupled to an upper surface of the top plate, wherein a thermal break is disposed between the structural support assembly and the top plate.

6. The substrate processing system of claim 1, further comprising a plurality of thermal cutoff switches controlled by the system controller and configured to control power to the heaters such that a temperature in each region is between a minimum operating temperature and a maximum operating temperature.

7. The substrate processing system of claim 6, wherein the system controller further comprises a non-transitory computer readable medium comprising computer-executable instructions that, when executed by a processing system, cause the processing system to perform a method comprising:
(a) heating each region with a portion of the plurality of heaters in the region until a thermal cutoff switch of the plurality of thermal cutoff switches senses the maximum operating temperature,
(b) turning off the plurality of heaters in the region until the thermal cutoff switch of the plurality of thermal cutoff switches senses the minimum operating temperature; and
(c) repeating (a) and (b) at least one more time.

8. The substrate processing system of claim 7, wherein the minimum operating temperature is about 80° C. and the maximum operating temperature is about 90° C.

9. The substrate processing system of claim 1, wherein the plurality of heaters comprises cartridge heaters.

10. A substrate processing system, comprising:
a processing chamber, comprising:
a top plate having an array of process station openings that surround a central axis,
a bottom plate having a central opening, and
a plurality of side walls connecting the top and bottom plates, wherein a chamber volume is defined by the top plate, the bottom plate, and the plurality of side walls; and
a first plurality of heater assemblies disposed in the top plate and the bottom plate, wherein:
each heater assembly of the first plurality of heater assemblies comprises a plurality of upper heaters and a plurality of lower heaters,
each upper heater and each lower heater of the first plurality of heater assemblies is positioned between adjacent openings of the array of process station openings and extends inward towards the central opening,
each upper heater of one heater assembly of the first plurality of heater assemblies is a same length,
the upper heaters of the remaining heater assemblies of the first plurality of heater assemblies alternate in length, and
the lower heaters of the first plurality of heater assemblies alternate in length.

11. The substrate processing system of claim 10, further comprising a second plurality of heater assemblies disposed in the bottom plate, wherein each heater assembly of the second plurality of heater assemblies is disposed in a corner of the processing chamber.

12. The substrate processing system of claim 10, wherein each heater assembly of the first plurality of heater assemblies comprises a heating element and a sheath.

* * * * *